United States Patent
Okabe et al.

(10) Patent No.: US 8,987,852 B2
(45) Date of Patent: Mar. 24, 2015

(54) SOLID-STATE IMAGE PICKUP APPARATUS, IMAGE PICKUP SYSTEM INCLUDING SOLID-STATE IMAGE PICKUP APPARATUS, AND METHOD FOR MANUFACTURING SOLID-STATE IMAGE PICKUP APPARATUS

(75) Inventors: Takehito Okabe, Atsugi (JP); Kentarou Suzuki, Kawasaki (JP); Taskashi Usui, Ashigarakami-gun (JP); Taro Kato, Kawasaki (JP); Mineo Shimotsusa, Machida (JP); Shunsuke Takimoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/366,189

(22) Filed: Feb. 3, 2012

(65) Prior Publication Data
US 2012/0199893 A1    Aug. 9, 2012

(30) Foreign Application Priority Data

Feb. 9, 2011  (JP) .................. 2011-026347
Oct. 7, 2011  (JP) .................. 2011-223291

(51) Int. Cl.
*H01L 21/00* (2006.01)
*H01L 27/146* (2006.01)

(52) U.S. Cl.
CPC .... *H01L 27/14641* (2013.01); *H01L 27/14629* (2013.01); *H01L 27/14632* (2013.01); *H01L 27/14685* (2013.01); *H01L 27/14687* (2013.01)
USPC ............ 257/432; 257/E21.002; 257/E31.127; 438/69

(58) Field of Classification Search
None
See application file for complete search history.

(56) References Cited

U.S. PATENT DOCUMENTS

| | | | | |
|---|---|---|---|---|
| 4,540,466 A | * | 9/1985 | Nishizawa | 438/708 |
| 5,232,507 A | * | 8/1993 | Ohtoshi et al. | 118/719 |
| 5,968,610 A | * | 10/1999 | Liu et al. | 438/435 |
| 6,448,112 B2 | * | 9/2002 | Lee | 438/128 |
| 2002/0137323 A1 | * | 9/2002 | Loboda | 438/600 |
| 2006/0138577 A1 | * | 6/2006 | Hashimoto | 257/432 |
| 2008/0029793 A1 | | 2/2008 | Watanabe et al. | |
| 2009/0166518 A1 | * | 7/2009 | Tay et al. | 250/227.11 |
| 2009/0242890 A1 | * | 10/2009 | Miyasaka et al. | 257/66 |
| 2012/0202310 A1 | * | 8/2012 | Sawayama et al. | 438/69 |

FOREIGN PATENT DOCUMENTS

| | | |
|---|---|---|
| JP | 2006-191000 A | 7/2006 |
| JP | 2007-173258 A | 7/2007 |

(Continued)

*Primary Examiner* — Bilkis Jahan
*Assistant Examiner* — Kevin Quinto
(74) *Attorney, Agent, or Firm* — Canon USA, Inc. IP Divison

(57) ABSTRACT

A method for manufacturing a solid-state image pickup device is provided. The image pickup apparatus includes a photoelectric conversion portion disposed on the semiconductor substrate, a first insulating film over the photoelectric conversion portion, functioning as an antireflection film, a second insulating film on the first insulating film, disposed corresponding to the photoelectric conversion portion, and a waveguide having a clad and a core whose bottom is disposed on the second insulating film. The method includes forming an opening by anisotropically etching part of a member disposed over the photoelectric conversion portion, thereby forming the clad, and forming the core in the opening. In the method, the etching is performed under conditions where the etching rate of the second insulating film is lower than the etching rate of the member.

19 Claims, 22 Drawing Sheets

(56) References Cited

FOREIGN PATENT DOCUMENTS

| | | |
|---|---|---|
| JP | 2008-041726 A | 2/2008 |
| JP | 2008-091800 A | 4/2008 |
| JP | 2010-206180 A | 9/2010 |
| WO | 2009/091484 A | 7/2009 |

\* cited by examiner

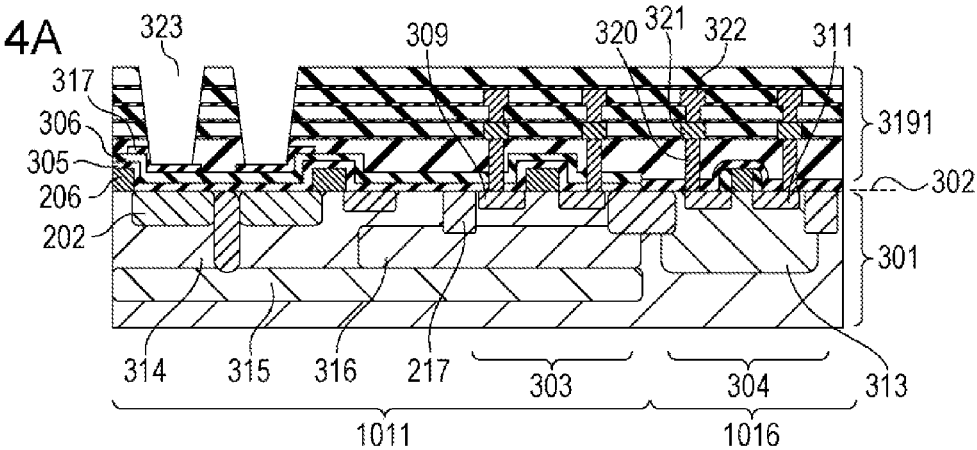
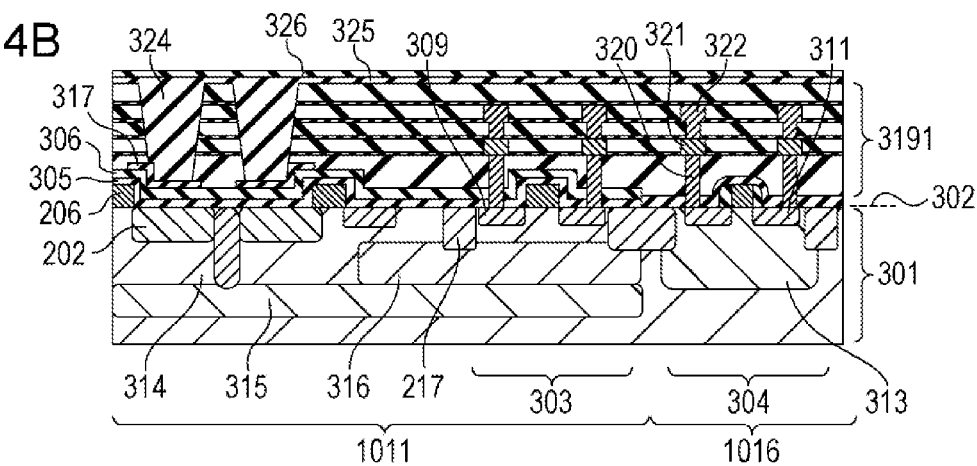
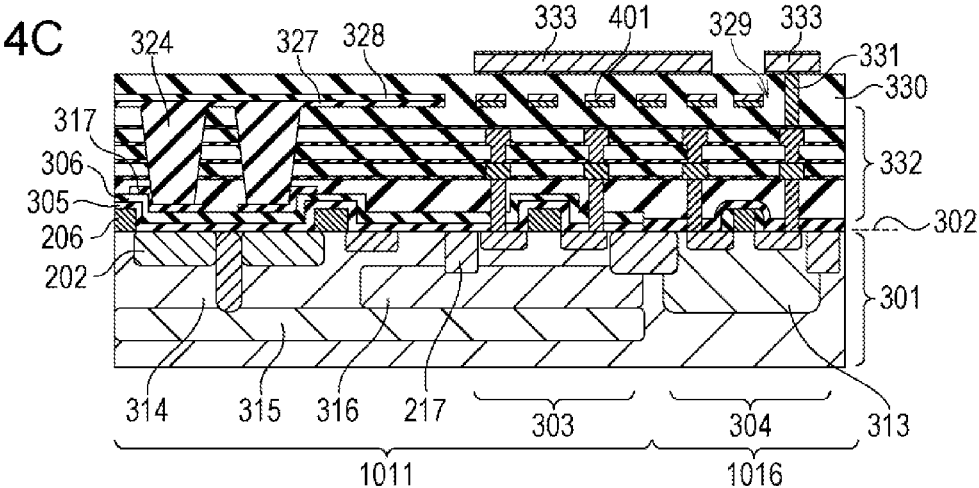

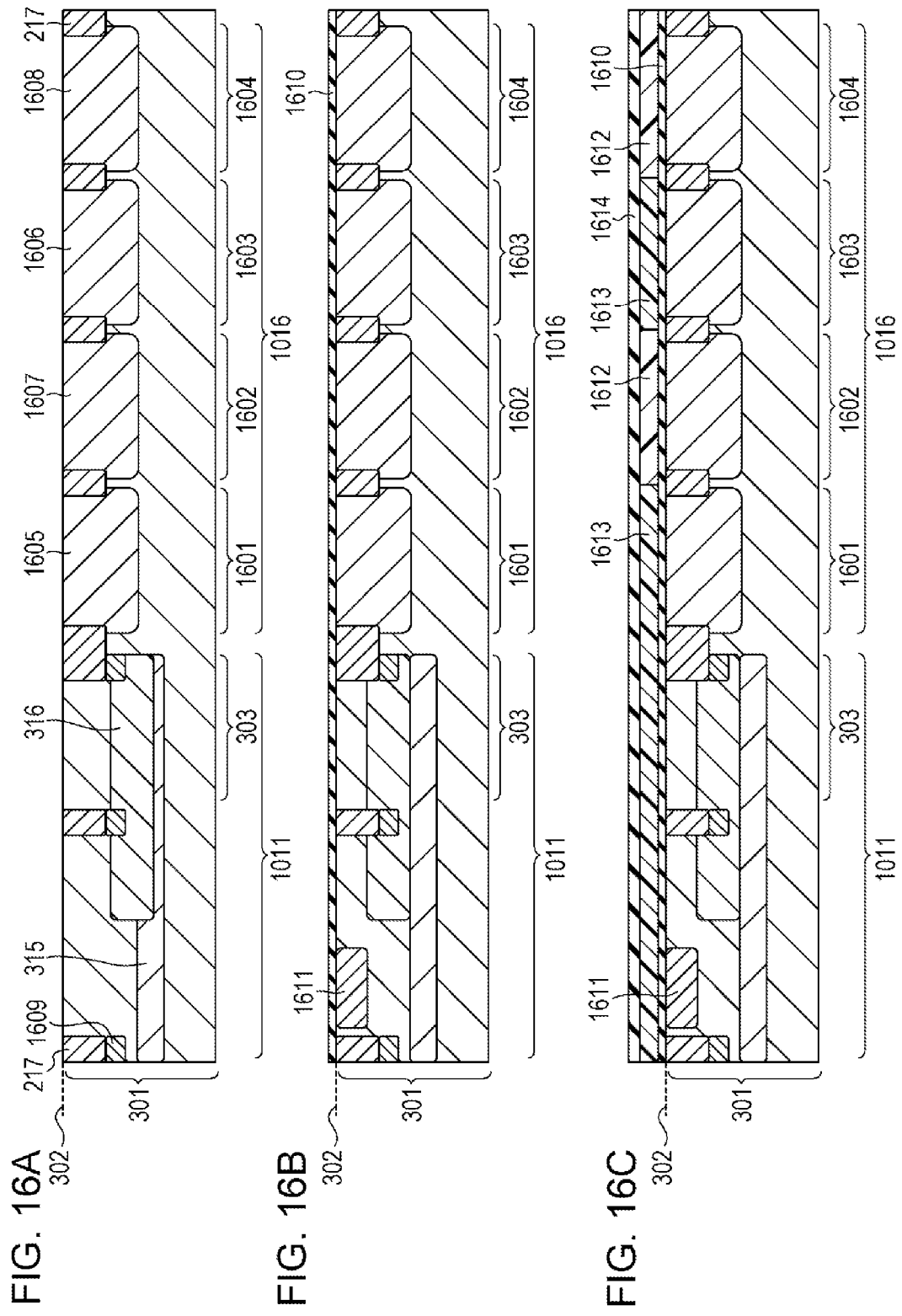

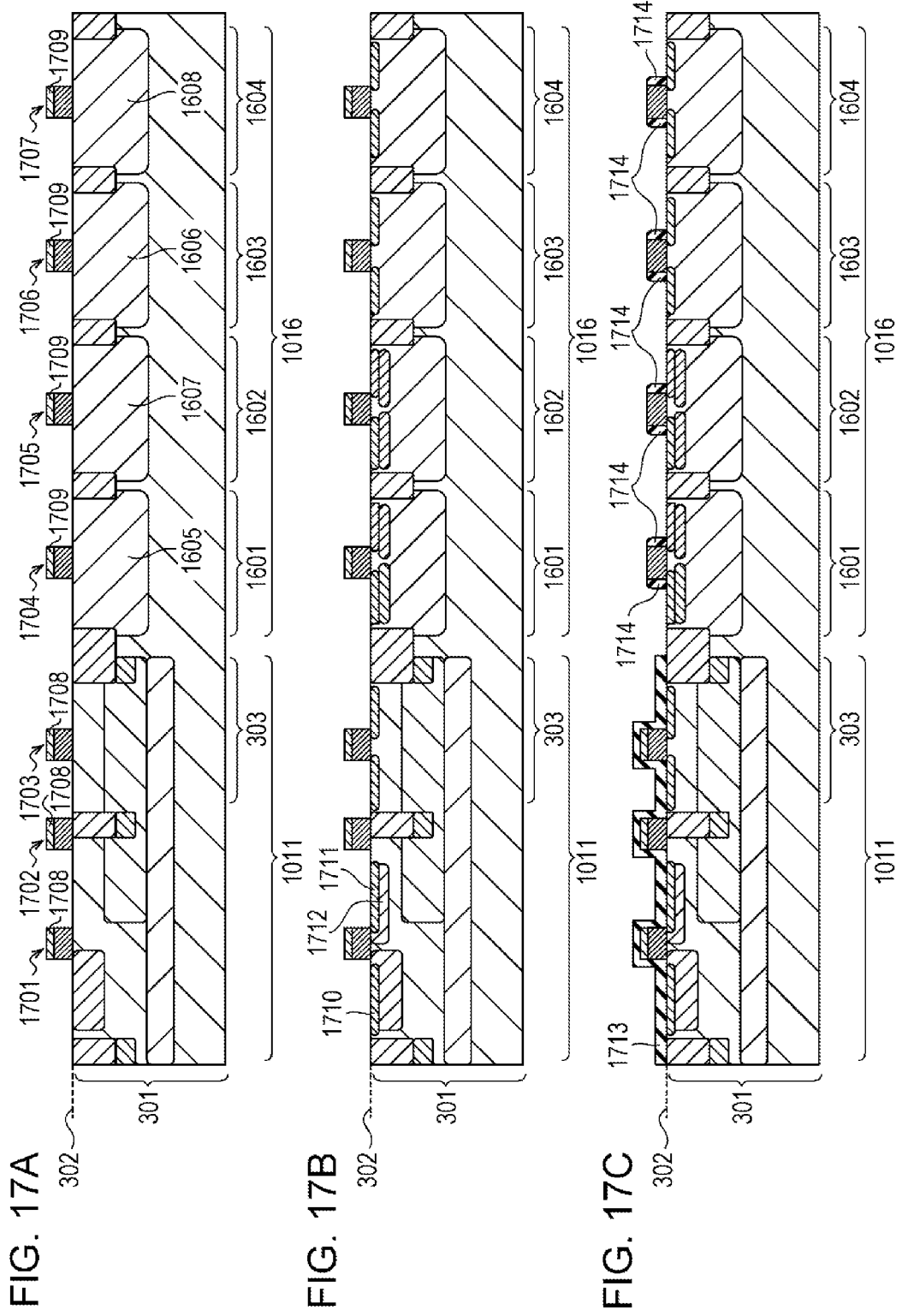

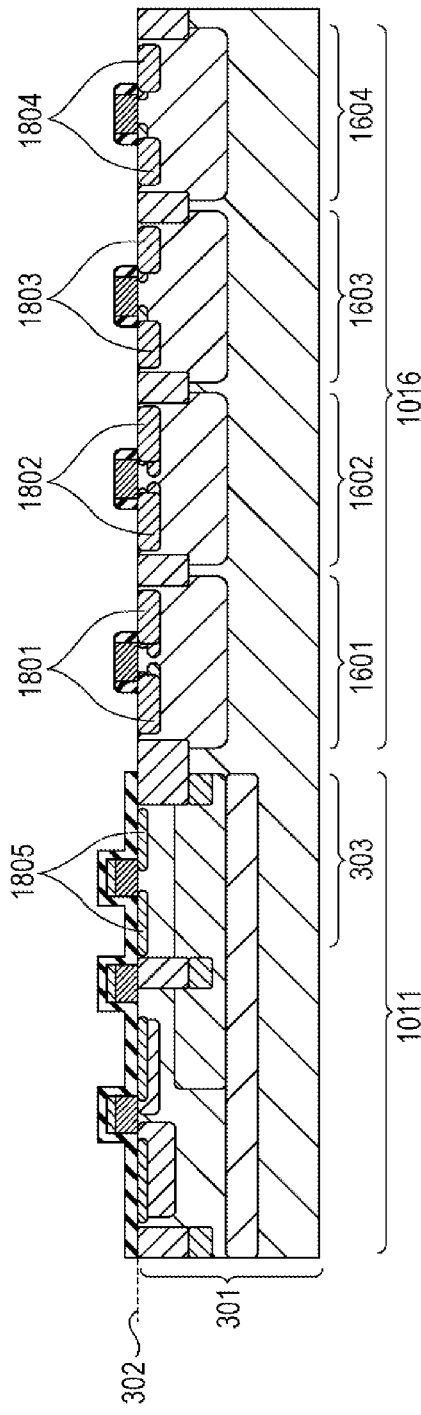
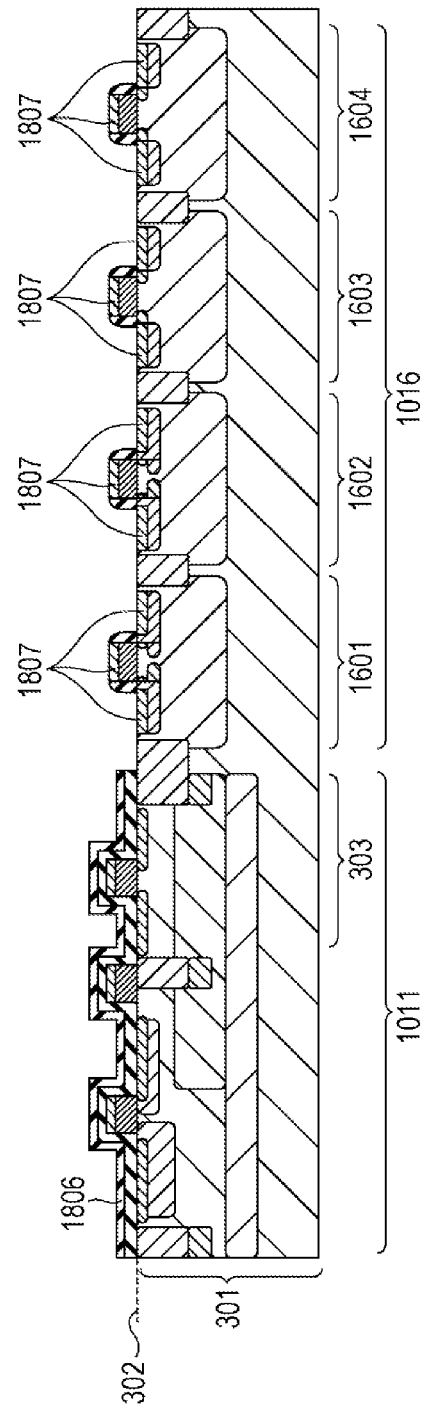

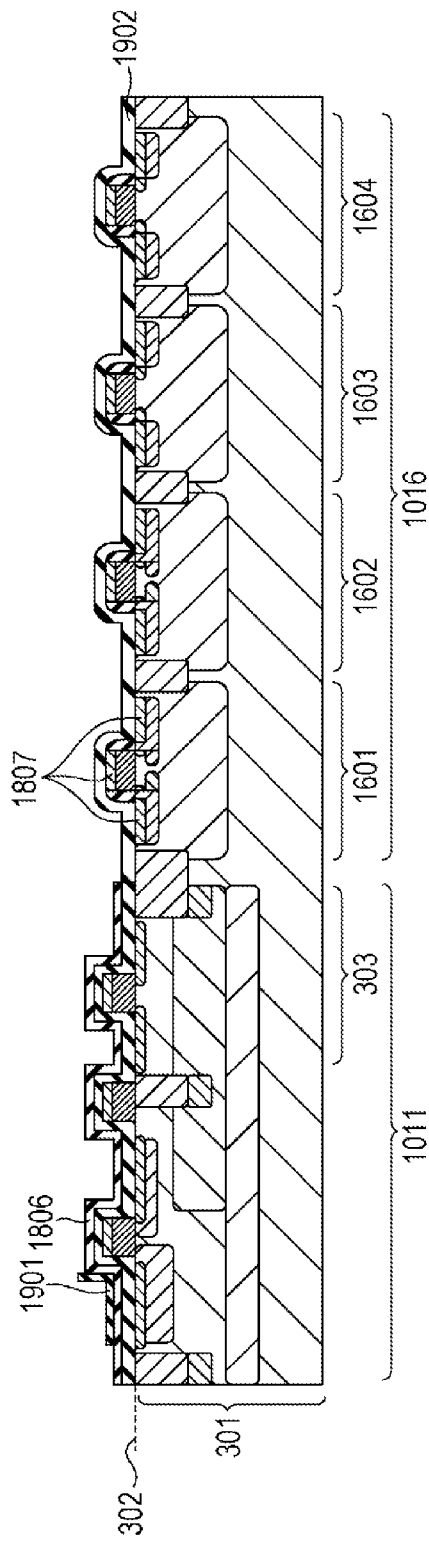
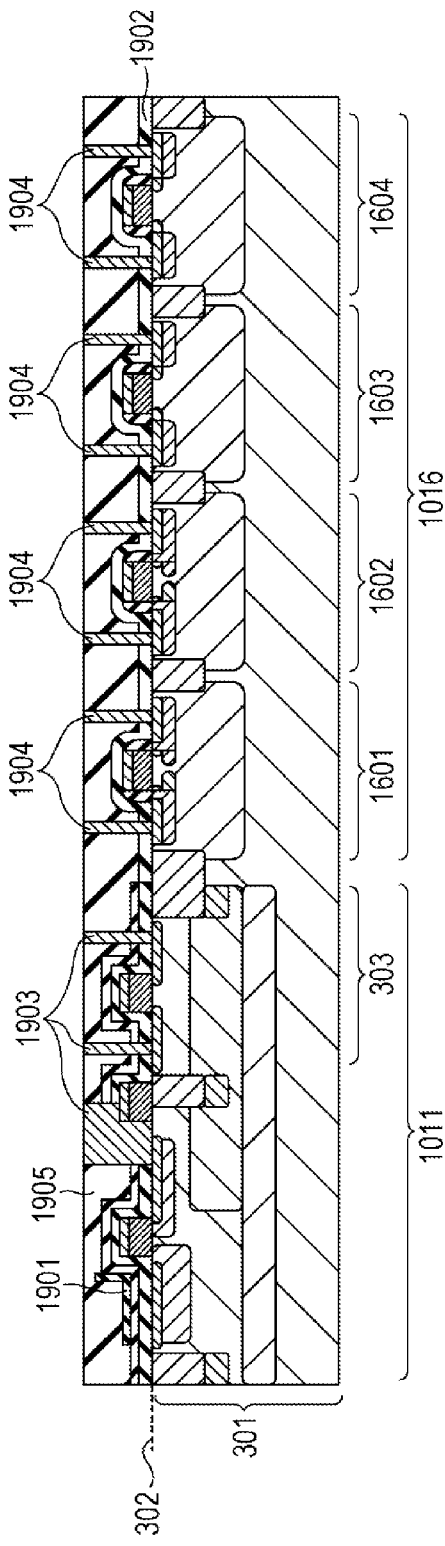

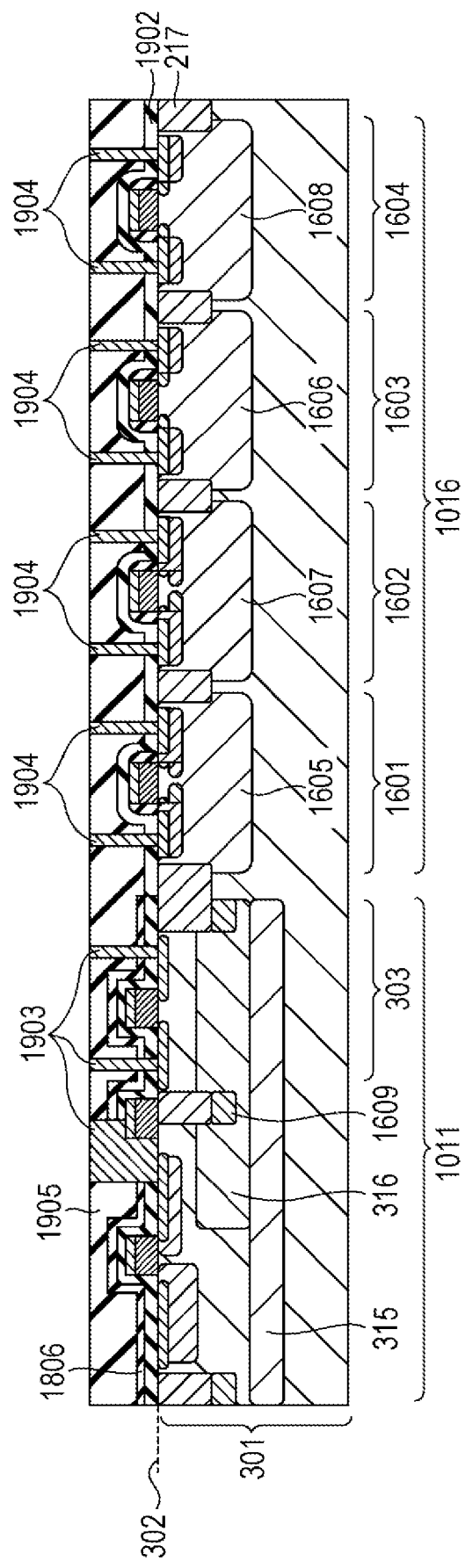

SOLID-STATE IMAGE PICKUP APPARATUS, IMAGE PICKUP SYSTEM INCLUDING SOLID-STATE IMAGE PICKUP APPARATUS, AND METHOD FOR MANUFACTURING SOLID-STATE IMAGE PICKUP APPARATUS

BACKGROUND OF THE INVENTION

1. Field of the Invention

The present invention relates to a solid-state image pickup apparatus, an image pickup system including the solid-state image pickup apparatus, and a method for manufacturing the solid-state image pickup apparatus.

2. Description of the Related Art

In order to increase the quantity of light that is to enter the photoelectric conversion portion of a solid-state image pickup apparatus, it has been recently proposed that a waveguide is used in the solid-state image pickup apparatus. Japanese Patent Laid-Open No. 2006-191000 discloses that in a solid-state image pickup apparatus including a waveguide, an etching stop film used for forming the waveguide doubles as an antireflection film over the light-receiving portion.

Japanese Patent Laid-Open No. 2008-041726 discloses that the pixel section is provided with an etching stop film for etching for forming contact holes.

SUMMARY OF THE INVENTION

The present invention provides a method for manufacturing a solid-state image pickup apparatus including a photoelectric conversion portion disposed in a semiconductor substrate, a first insulating film functioning as an antireflection film over the photoelectric conversion portion, a second insulating film on the first insulating film, disposed corresponding to the photoelectric conversion portion, and a waveguide having a clad and a core whose bottom is disposed on the second insulating film. The method includes forming an opening by partially etching a member disposed over the photoelectric conversion portion under conditions where the member is etched faster than the second insulating film, thereby forming the clad, and forming the core in the opening.

A solid-state image pickup apparatus according to an aspect of the invention includes a plurality of photoelectric conversion portions disposed in a semiconductor substrate. A first insulating film is disposed over the photoelectric conversion portions and functions as an antireflection film. A plurality of second insulating films are disposed on the first insulating film, corresponding to the photoelectric conversion portions. Each second insulating film has functioned as an etching stop film. The solid-state image pickup apparatus further includes a plurality of waveguides, each including a clad and a core whose bottom is in contact with the corresponding second insulating film. The core is made of the same material as the second insulating film.

Further features of the present invention will become apparent from the following description of exemplary embodiments with reference to the attached drawings.

BRIEF DESCRIPTION OF THE DRAWINGS

FIGS. 4A to 4C are representations of the method for manufacturing the solid-state image pickup apparatus of the first embodiment.

FIGS. 16A to 16C are schematic representations of a method for manufacturing a solid-state image pickup apparatus according to an eighth embodiment.

FIGS. 17A to 17C are schematic sectional views of the method for manufacturing the solid-state image pickup apparatus of the eighth embodiment.

FIGS. 18A and 18B are schematic sectional views of the method for manufacturing the solid-state image pickup apparatus of the eighth embodiment.

FIGS. 19A and 19B are schematic sectional views of the method for manufacturing the solid-state image pickup apparatus of the eighth embodiment.

FIG. 21 is a schematic sectional view of a solid-state image pickup apparatus according to a ninth embodiment.

DESCRIPTION OF THE EMBODIMENTS

Figure 1:
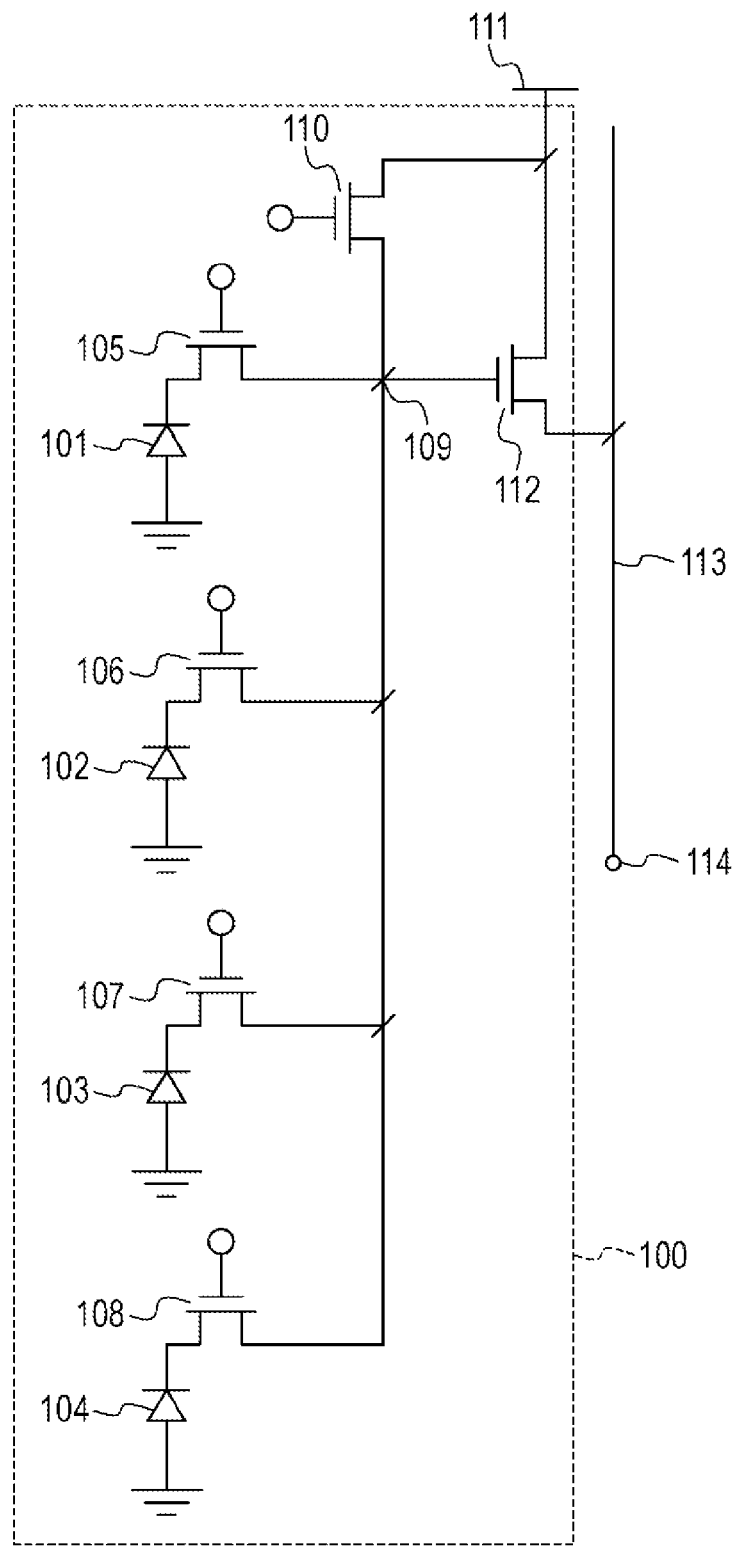
FIG. 1 is a circuit diagram of a pixel cell of a solid-state image pickup apparatus of a first embodiment.

The etching stop film used in Japanese Patent Laid-Open No. 2006-191000 for forming a waveguide can be partially etched, and, thus, the thickness of the etching stop film may be reduced, or the film may be damaged by etching. Consequently, the optical properties of the etching stop film acting as an antireflection film may be degraded.

In Japanese Patent Laid-Open No. 2008-041726, an etching stop film is not used for etching for forming contact holes in regions other than the pixel section. If some damage occurs during etching, noise can occur and consequently degrade image quality. The present invention solves at least one of these issues.

The present invention relates to a method for manufacturing a solid-state image pickup apparatus including, for example, a photoelectric conversion portion disposed on a semiconductor substrate, a first insulating film, a second insulating film, and a waveguide. The first insulating film acts as an antireflection film over the photoelectric conversion portion. The second insulating film is disposed on the first insulating film and corresponds to the photoelectric conversion portion. The waveguide has a clad and a core whose bottom is disposed on the second insulating film. In a method for manufacturing the solid-state image pickup apparatus, the clad is formed by forming an opening by partially etching a member disposed over the photoelectric conversion portion, and the core is formed in the opening. For forming the opening, the etching is performed under the conditions where the etching rate of the second insulating film is lower than the etching rate of the member. This method can prevent the degradation of the optical properties of the antireflection film.

The solid-state image pickup apparatus includes a plurality of photoelectric conversion portions on a semiconductor substrate, a first insulating film functioning as an antireflection film over the photoelectric conversion portions, and a plurality of second insulating films disposed on the first insulating film so as to correspond to the respective photoelectric conversion portions. The solid-state image pickup apparatus further includes a plurality of waveguides, each including a clad and a core made of the same material as the second insulating film. The bottom of the core is in contact with the second insulating film. The solid-state image pickup apparatus having such a structure can exhibit enhanced sensitivity.

Exemplary embodiments of the invention will now be described with reference to the drawings. In the description below, parts and steps in common structures and manufacturing methods of semiconductors will not be illustrated in detail. In the following embodiments, the refractive index of silicon nitride is higher than the refractive index of silicon oxide, and the refractive index of silicon oxynitride lies between those refractive indices. For example, silicon nitride has a refractive index of about 1.75 to 2.34, and silicon oxide has a refractive index of about 1.35 to 1.54. Visible light has wavelengths in the range of about 360 to 830 nm (Iwanami Rikagaku Jiten, 5th edition, published by Iwanami Shoten).

Openings mentioned herein may pass through interlayer insulating films, or may be in the form of a recess without passing through the interlayer insulating films, and may be referred to as holes. In the following description, embodiments having waveguides will be described in structures in which openings are formed. However, the openings are not limited to this use. The embodiments of the invention can be generally applied to semiconductor devices. The etching selectivity mentioned herein refers to the ratio of the etching rate of a first member to the etching rate of a second member. As the etching selectivity is increased, the first member will be more etched. In contrast, as the etching selectivity is reduced, the second member will be more etched with the first member. The same material mentioned herein refers to a material containing the same main constituent. For example, silicon nitride may have different nitrogen contents, and these are considered to be the same material in the embodiments below.

First Embodiment

The solid-state image pickup apparatus of a first embodiment will now be described with reference to FIGS. 1 to 7, and FIG. 10. The description will first refer to FIGS. 1, 2, 7 and 10.

FIG. 1 is a circuit diagram of the pixel cell of the solid-state image pickup apparatus of the first embodiment. The pixel cell 100 includes four photodiodes (hereinafter referred to as PD) 101 to 104, four transfer transistors 105 to 108, a single reset transistor 110, and a single amplification transistor 112. Also, a floating diffusion node (hereinafter referred to as FD node) 109 is provided. In the description of the first embodiment, signal charges refer to electrons, and transistors are of n type.

The four PDs 101 to 104, whose anodes are each connected to the ground, convert incident light into charge according to the quantity of the incident light and store the charge. Each of the four transfer transistors 105 to 108 functions as a transmitter to transmit the signal charge generated at the corresponding one of the PDs 101 to 104 to the FD node 109. More specifically, the first PD 101 is connected to the source of the first transfer transistor 105, and the second PD 102 is connected to the source of the second transfer transistor 106. Also, the third PD 103 is connected to the source of the third transfer transistor 107, and the fourth PD 104 is connected to the source of the fourth transfer transistor 108. The drains of the first to fourth transfer transistors 105 to 108 are connected together to define the FD node 109. The gate electrode of the amplification transistor 112 is connected to the FD node 109. The drain and the source of the amplification transistor 112 are connected to a power supply line 111 and an output signal line 113, respectively. Thus a signal according to the potential of the FD node 109 is outputted to the output signal line 113. A reset transistor 110 is connected to the FD node 109, and resets the potential of the FD node 109 to a desired potential. At the same time, the PDs 101 to 104 can be reset by applying a current to the transfer transistors 105 to 108, respectively. The power supply line 111 has at least two potentials, and signals can be outputted to the output signal line 113 by setting the FD node 109 at two potentials. The output signal line is connected to a plurality of pixels. The terminal of the output signal line 113 is connected to a readout circuit (described later).

When a repeating unit including at least one photoelectric conversion portion defines a pixel, the pixel cell 100 shown in FIG. 1 has four pixels. However, the number of pixels in the pixel cell 100 is not limited to four. Also, the pixel cell 100 may include a selection transistor or a capacitor. Although the PDs act as photoelectric conversion portions in the present embodiment, photogates may be used as the photoelectric conversion portions.

Figure 10:
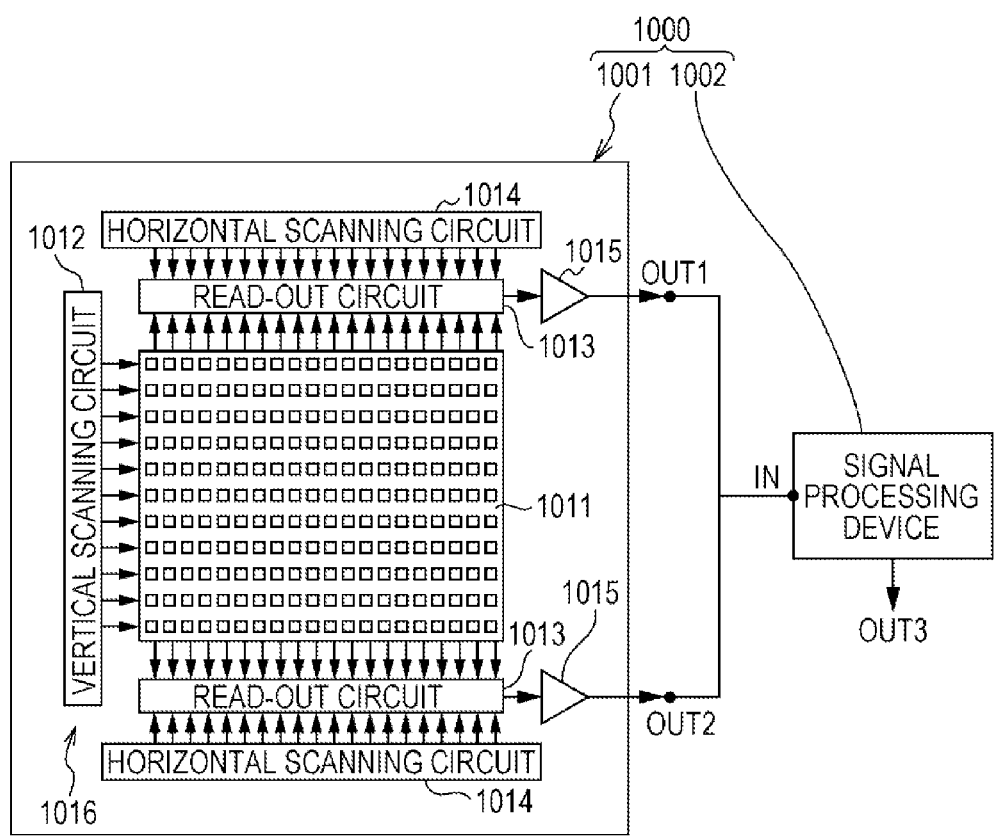
FIG. 10 is a block diagram of a solid-state image pickup apparatus and an image pickup system.

FIG. 10 shows a schematic configuration of a solid-state image pickup apparatus and an image pickup system. In FIG. 10, the solid-state image pickup apparatus 1001 includes a pixel section 1011, a vertical scanning circuit 1012, two readout circuits 1013, two horizontal scanning circuits 1014, and two output amplifiers 1015. The region other than the pixel section is referred to as a peripheral circuit section 1016.

In FIG. 10, a plurality of pixel cells shown in FIG. 1 are arranged in a two-dimensional manner in the pixel section 1011. In other words, a plurality of pixels are arranged in the pixel section 1011. Each pixel cell includes a plurality of pixels. Each readout circuit 1013 includes, for example, a column amplifier, a CDS circuit and an adder, and performs amplification and addition of the signals read from the pixels in a row selected by the vertical scanning circuit 1012 through the vertical signal lines. The column amplifier, the CDS circuit and the adder are provided for each pixel column or for every two or more pixel columns. Each horizontal scanning circuit 1014 generates a signal for reading signals out of the corresponding readout circuit 1013 one after another. Each output amplifier 1015 amplifies the signal in a column selected by the horizontal scanning circuit 1014 and outputs the amplified signal. This configuration is merely one of the exemplary embodiments of the solid-state image pickup apparatus, and other configurations may be provided in other embodiments. For example, the readout circuit 1013, the horizontal scanning circuits 1014 and the output amplifier 1015 form two output paths, one each disposed at each side in the vertical direction of the pixel section 1011. In another embodiment, however, three or more output paths may be provided.

Figure 2:
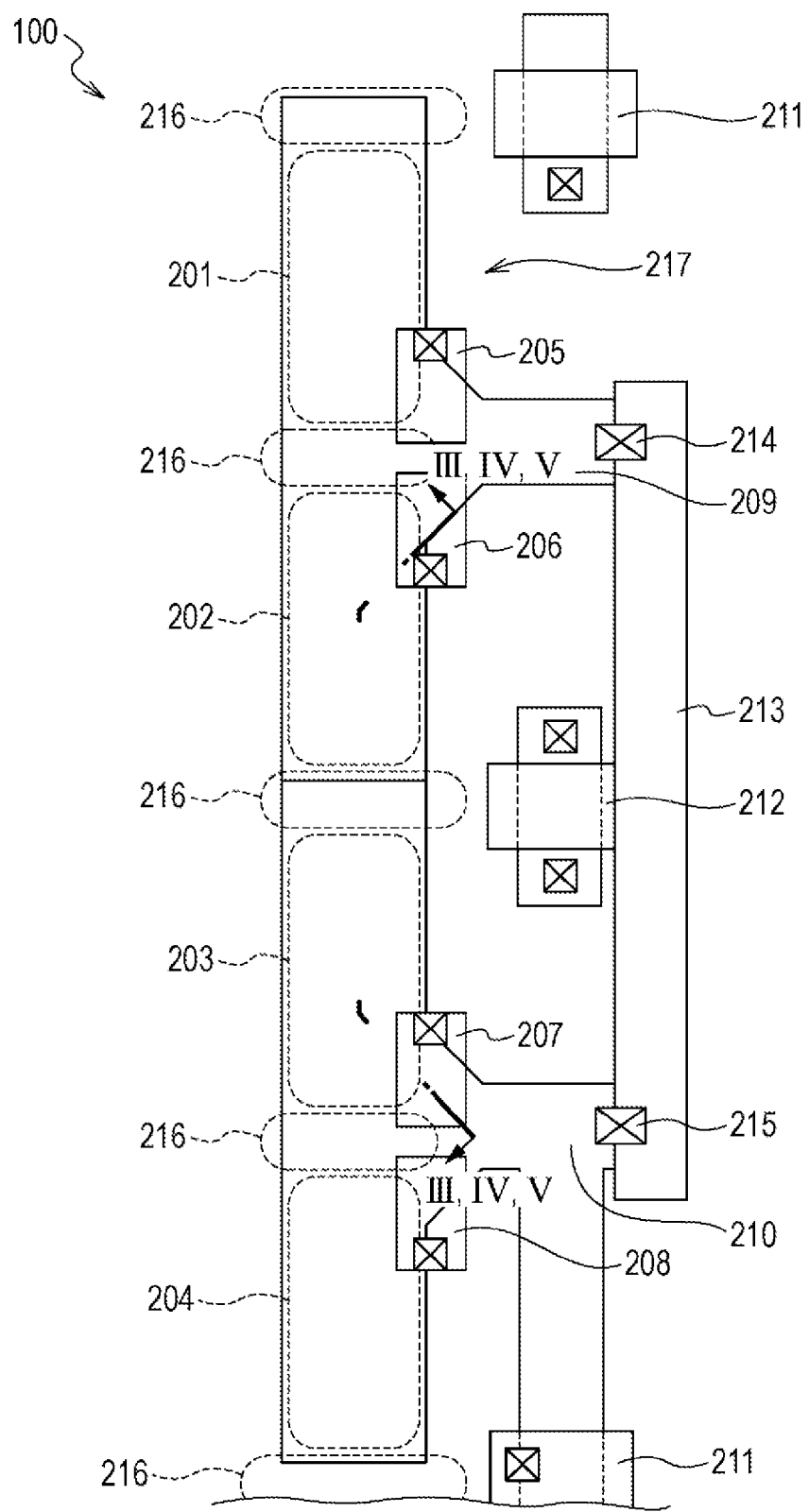
FIG. 2 is a representation showing the layout in plan view of the pixel cell of the solid-state image pickup apparatus of the first embodiment.

A layout in plan view corresponding to FIG. 1 will now be described with reference to FIG. 2. FIG. 2 is a schematic plan view of the layout in plan view, and shows the structure on the main surface of a semiconductor substrate, projecting the outlines of components on the main surface. In the structure shown in FIG. 2, a first to a fourth PD 201 to 204 are disposed. For the sake of simplicity, FIG. 2 shows charge storage regions (n-type semiconductor regions), which are part of the PDs. The gate electrodes 205 to 208 of a first to a fourth transfer transistor are arranged corresponding to the first to fourth PDs 201 to 204, respectively. The drains of the first transfer transistor and the second transfer transistor are common, and this common region acts as a first floating diffusion region 209 (hereinafter referred to as first FD region). The drains of the third transfer transistor and the fourth transfer transistor are common, and this common region acts as a second floating diffusion region 210 (hereinafter referred to as second FD region). The first FD region 209, the second FD region 210, and the gate electrode 212 of an amplification transistor 212 are connected through a connection wiring line 213. The gate electrode 212 of the amplification transistor and the connection wiring line 213 are integrated. The first FD region 209 and the connection wiring line 213 are connected with a shared contact 214, and the second FD region 210 and the connection wiring line 213 are connected with a shared contact 215. The shared contact refers to a contact connecting a semiconductor region to another semiconductor region, a semiconductor region to a gate electrode, or a gate electrode to another gate electrode, without using a wiring layer. In FIG. 2, the second FD region 210 is a common region with the source or drain of a reset transistor. Reference numeral 211 designates the gate electrode of the reset transistor.

In FIG. 2, the regions in which the PDs and the regions intended as the sources, drains and channels of the transistors have been formed are active regions, and the other regions are element isolation regions 217. Regions between the PDs or between the gate electrodes of the transfer transistors in the active region are each provided with a potential barrier 216 for the signal charge. The potential barrier 216 comprises semiconductor regions. The potential barrier 216 functions as an element isolation region that controls the traffic of the signal charge between the PDs.

Figure 7:
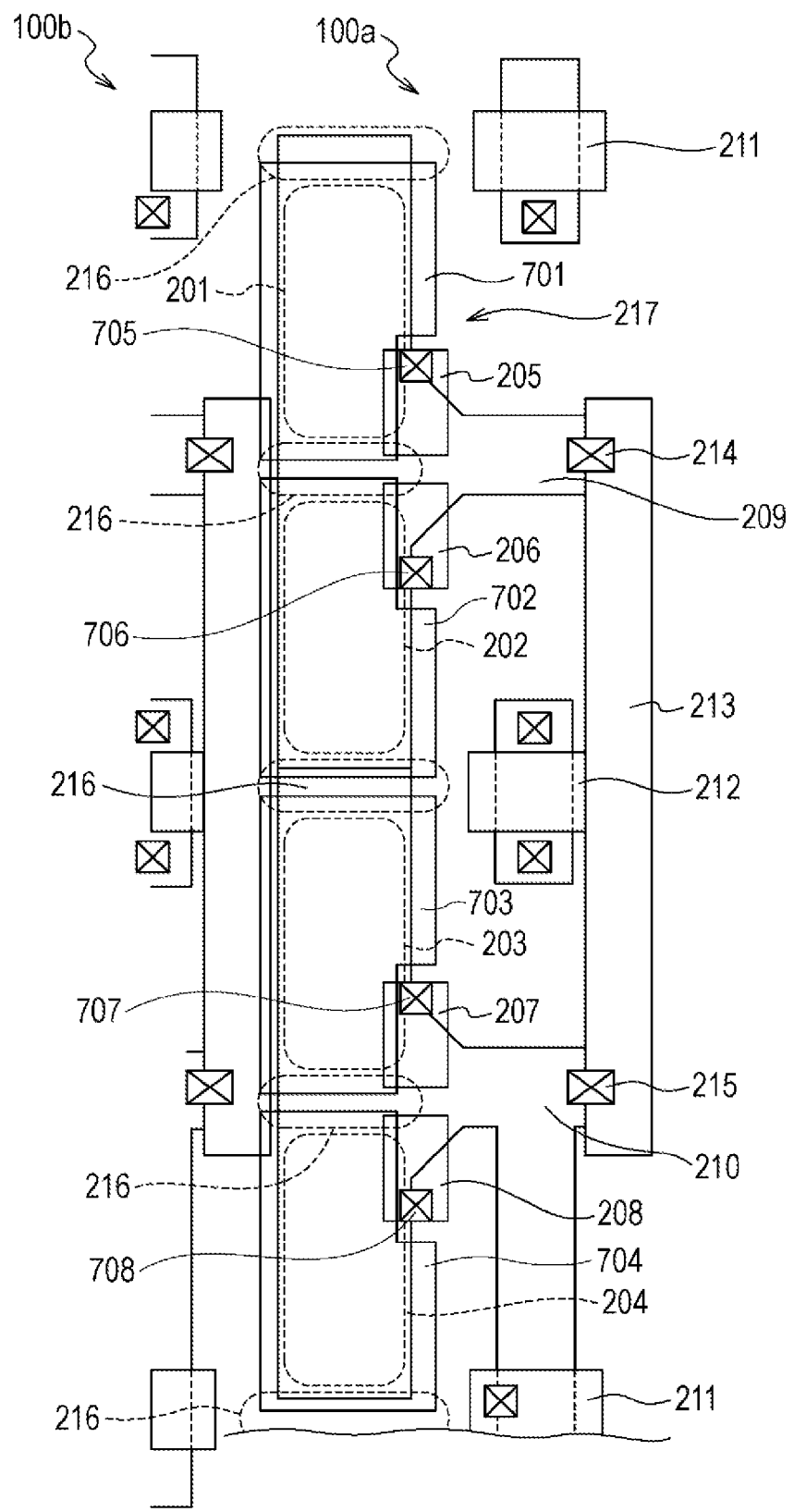
FIG. 7 is a schematic representation of the layout in plan view of the first embodiment.

The etching stop film will now be described with reference to FIG. 7. FIG. 7 is a schematic plan view of a layout in plan view corresponding to that in FIG. 2. FIG. 7 shows a pixel cell 100a and part of an adjacent pixel cell 100b. In the layout shown in FIG. 7, insulating films 701 to 704 functioning as etching stop films are disposed. The insulating films 701 to 704 are arranged corresponding one to one to the charge storage regions. The insulating films 701 to 704 may be made of silicon nitride. The insulating films 701 to 704 each have a larger area than the area of the light-receiving surface of the photoelectric conversion portion, and are arranged in such a manner that the outer edge of each insulating film 701 to 704 does not overlap with the corresponding charge storage region 201 to 204 that is the photoelectric conversion portion, if possible. This is because such an arrangement can prevent the charge storage regions 201 to 204 from being damaged by patterning for forming the insulating films 701 to 704. Accordingly, the insulating films 701 to 704 shown in FIG. 7 are arranged so as to cover part of the gate electrodes 205 to 208 of the transfer transistors and part of the connection wiring line 213 of the adjacent pixel cell 100b. This arrangement can prevent the gate electrodes and the wiring line from being damaged by etching for forming openings that will be described later.

Also, the insulating films 701 to 704 are disposed so as not to overlap with the contacts 705 to 708 on the gate electrodes 205-208 and regions where contacts of other transistors are disposed. This facilitates the formation of the contacts 705 to 708 and contacts of other transistors.

A method for manufacturing the solid-state image pickup apparatus will now be described with reference to FIGS. 3A to 5B. FIGS. 3A to 5B are sectional views taken along line III, IV, V-III, IV, V in FIG. 2 and illustrate the manufacturing method. FIGS. 3A to 5B show the sections of the second and third PDs taken along line III, IV, V-III, IV, V in FIG. 2, a transistor 303 of the pixel cell, and a transistor 304 in the peripheral circuit section. These parts are designated by the same reference numerals as above, and thus description thereof is omitted. Also, parts that can be formed by common techniques will not be described in detail.

Figure 3A:
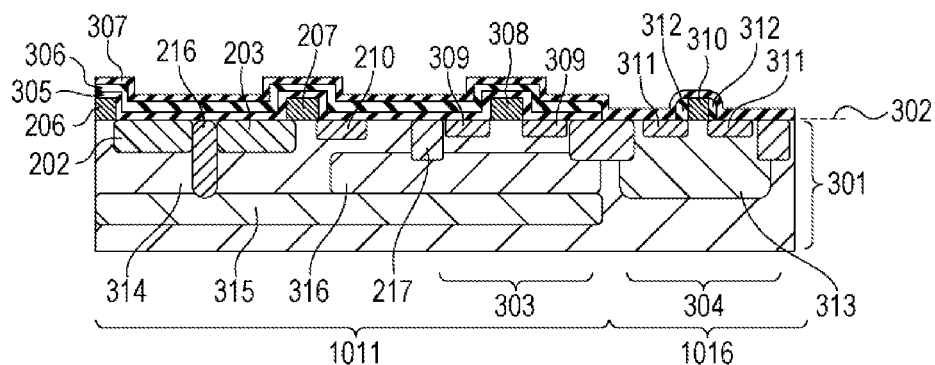
FIGS. 3A to 3C are representations of a method for manufacturing the solid-state image pickup apparatus of the first embodiment.

First, an operation for preparing a semiconductor substrate on which elements have been disposed will be descried with reference to FIG. 3A. The semiconductor substrate 31 to be prepared is made of silicon and has a main surface 302. The semiconductor substrate 301 has the charge storage regions 202 and 203 of two PDs, a transistor 303 in a pixel section, and a transistor 304 in a peripheral circuit section. In FIG. 3A, the transistor 303 of the pixel cell has N-type source/drain regions 309 and a gate electrode 308. An N-type semiconductor region 314 lies under the charge storage regions 202 and 203. The N-type semiconductor region 314 has a lower impurity concentration than the charge storage regions 202 and 203, and constitutes part of the photoelectric conversion portions. The N-type semiconductor region 314 overlies a P-type semiconductor region 315 that functions as part of the photoelectric conversion portions. Also, a P-type semiconductor region 316 underlies the source/drain regions 309 of the transistor 303 and the second FD region 210. The transistor 304 in the peripheral circuit section is one of the transistors constituting a CMOS circuit. The transistor 304 of the peripheral circuit section includes an N-type source/drain regions 311 formed in a P-type semiconductor region 313, and a gate electrode 310 on the main surface 302 of the semiconductor substrate between the source/drain regions 311. The semiconductor substrate 301 having those elements is prepared. Since the elements of the semiconductor substrate 301 can be formed by known methods, and thus description is omitted. In each figure, gate insulating films are not shown.

FIG. 3A shows the step of forming insulating films over the elements. An insulating film made of silicon oxide (not shown), an insulating film 305 made of silicon nitride, and an insulating film 306 made of silicon oxide are formed in that order from the main surface 302 in the pixel section 1011. These insulating films may be formed of plasma chemical vapor deposition (plasma CVD).

The transistor 304 has side spacers 312 on the side walls of the gate electrode 310, and the source/drain regions 311 have a lightly doped drain (LDD) structure (not shown). The side spacer 312 is made of a multilayer film including a silicon oxide layer, a silicon nitride layer and a silicon oxide layer. These layers can be formed by plasma CVD. The film forming the side spacer 312 may be constituted of the same films as the insulating film (not shown) and insulating films 305 and 306 that are formed in the pixel section 1011.

Then, an insulating film 307 made of silicon nitride is formed over the pixel section 1011 and the peripheral circuit section 1016 by low-pressure plasma CVD (LP-CVD), as shown in FIG. 3A. Before forming the insulating film 307, a silicon oxide film (not shown) may be formed over the pixel section 1011 and the peripheral circuit section 1016 by plasma CVD. This is to prevent the main surface 302 of the semiconductor substrate from being exposed at the source/drain regions 311 of the transistor 304 in the peripheral circuit section 1016.

Figure 3B:
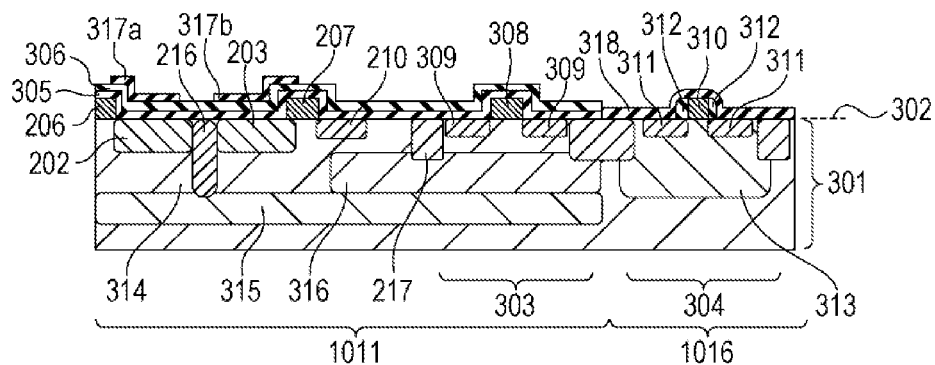

Turning to FIG. 3B, the insulating film 307 over the pixel section 1011 and the peripheral circuit section 1016 is patterned into desired shapes by a known lithography technique and etching technique, thus forming insulating films 317 and 318. The insulating film 317 is disposed over the charge storage regions 202 and 203, extending over the region from each photoelectric conversion portion to part of the gate electrode of the corresponding transfer transistor. The upper surfaces of the insulating films 317 and 318 have shapes following the shapes of the corresponding gate electrodes. The steps shown in FIGS. 3A and 3B form the insulating films 701 to 704 shown in FIG. 7. Insulating film 317a shown in FIG. 3B corresponds to insulating film 702 shown in FIG. 7, and insulating film 317b shown in FIG. 3B corresponds to insulating film 703 shown in FIG. 7. In the pixel section 1011, the other portion of the insulating film 307 shown in FIG. 3A is removed by etching. In the peripheral circuit section 1016, the insulating film 307 in FIG. 3A remains as an insulating film 318 without being etched.

Figure 3C:
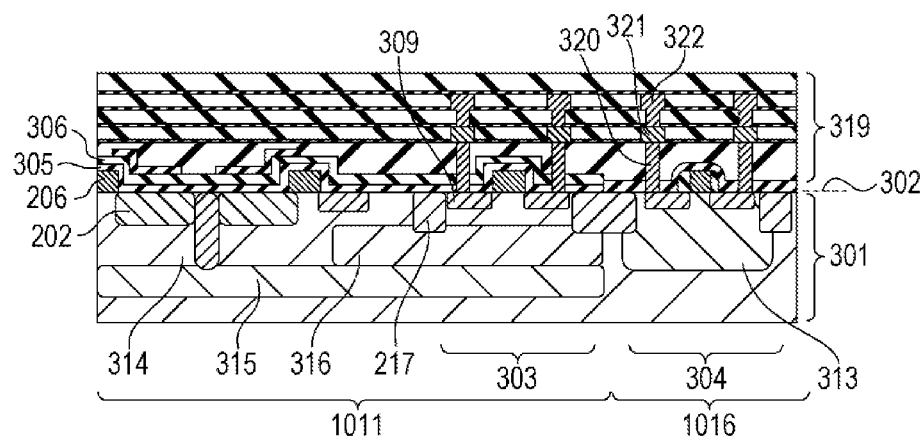

Turning to FIG. 3C, interlayer insulating films 319, contacts 320, a first wiring layer 321, and a second wiring layer 322 having via conductors are formed on the structure shown in FIG. 3B. A plurality of contacts and a plurality of wiring lines of the wiring layer are disposed. The interlayer insulating films 319 include insulating layers made of silicon oxide and insulating layers made of silicon nitride that are alternately disposed one on top of another. Each of the insulating layers made of silicon oxide is formed to a thickness of about 120 to 1000 nm by plasma CVD. Also, each of the insulating layers made of silicon nitride is formed to a thickness of about 10 to 200 nm by plasma CVD. Thus, silicon oxide occupies most of the interlayer insulating films 319. The silicon nitride insulating layers function as etching stop films used for forming the wiring layers and via conductors, or as anti-diffusion films to prevent the diffusion of the metal in the wiring layers. The interlayer insulating films 319 are intended to form clads of waveguides.

The contacts 320 are mainly made of tungsten and contain a barrier metal. For forming the contacts 320, the insulating film made of silicon oxide (not shown) and insulating films 305 and 306 are partially removed by plasma etching. If the insulating film 317 made of silicon nitride lies in the shape of the insulating film 307, however, etching is performed in the order of the insulating film 307 made of silicon nitride, the insulating film 306 made of silicon oxide, the insulating film 305 made of silicon nitride and the insulating film (not shown) made of silicon oxide. In this instance, it is difficult to change the etching conditions and to establish the conditions for stopping the etching. On the other hand, when the insulating films 317 are disposed, contact holes can be easily formed in an etching operation in which etching conditions are changed only once in a state where the insulating film 305 is used as an etching stop film.

The first wiring layer 321 and the second wiring layer 322 integrated with via conductors mainly contain copper. The first wiring layer 321 has a structure formed by a single damascene process, and the second wiring layer 322 has a structure formed by a dual damascene process in which via conductors are integrated with the wiring layer. The contacts and via conductors each have a barrier metal. The contacts and the via conductors are formed by a known method, and thus description thereof is omitted. The first and second wiring layers 321 and 322 may be formed by patterning, instead of damascene processes.

In FIG. 3C, the silicon nitride insulating layers in contact with the upper surface of the first or the second wiring layer function as anti-diffusion films to prevent the diffusion of the metal, or copper, of the wiring layers. On the other hand, the insulating layers disposed on the lower surface sides of the first and the second wiring layer function as etching stop films for forming the first and second wiring layers by damascene processes. The insulating layers functioning as etching stop films have a smaller thickness than the insulating layers functioning as anti-diffusion films. In the damascene processes, grooves for wiring lines or wiring lines and via conductors are formed in the insulating layers. For forming the grooves by etching, an etching stop film is useful to control the shape of the grooves. Accordingly, the insulating layers functioning as etching stop films are provided on the lower surface sides of the first wiring layer 321 and the second wiring layer 322. Since the etching stop films will be removed by forming grooves, the etching stop films are each formed in such a manner that the lower surface thereof will be flush with the lower surface of the first or second wiring layer or will lie above the level of the lower surface of the first or second wiring layer. A wafer previously provided with the structure shown in FIG. 3 may be prepared, and the following operation for forming openings is performed on the wafer.

Subsequently, the structure shown in FIG. 4A will be formed by forming openings 323 in the interlayer insulating films 319 shown in FIG. 3C. A photoresist pattern (not shown) having openings in the regions corresponding to the photoelectric conversion portions is formed over the interlayer insulating films 319, and etching is performed using the photoresist pattern as a mask. For the etching, anisotropic etching, for example, plasma etching, is performed. The interlayer insulating films 319 is removed by etching until the insulating film 317 is exposed. The insulating films 317 are intended to alleviate the damage to the photoelectric conversion portions from the etching, and also function as etching stop films. Also, the insulating films between the main surface 302 of the semiconductor substrate and the insulating films 317, that is, the insulating film made of silicon oxide (not shown) and insulating films 305 and 306, function as antireflection films of light coming into the semiconductor substrate. The thickness of the insulating film 306 is involved in the performance of the antireflection films in a multilayer structure. This is because the insulating film 306 causes multiple reflection and thus functions to reduce reflection between the insulating film 305 and the insulating films 317. The function as an etching stop film of the insulating film 317 maintains the insulating film 306 to a desired thickness, and consequently, the insulating film 306 can act as an antireflection film as intended. Even if the thickness of the insulating films 317 is varied by etching for removing part of the interlayer insulating films, this is not a large problem because the insulating films 317 will be integrated with a high-refractive-index member 324.

Subsequently, the openings 323 shown in FIG. 4A will be filled with a transparent material having a higher refractive index than the interlayer insulating films 3191 to form cores of the waveguides. In the present embodiment, the openings 323 are filled with silicon nitride, which has a higher refractive index than silicon oxide mainly forming the interlayer insulating films 3191. More specifically, the openings 323 are filled by depositing silicon nitride over the entire surface of the structure by high-density plasma CVD. Undesired silicon nitride deposited on the surface of the interlayer insulating films 3191 other than in the openings 323 is removed by chemical mechanical polishing (CMP) or plasma etching. The surface of silicon nitride is planarized by this removal operation, and, thus, high-refractive index members 324 are formed in the openings 323. Hence, the waveguide is constituted of the interlayer insulating films 3191 and the high-refractive-index member 324. The interlayer insulating films 3191 are the clad of the waveguides, and the high-refractive-index members 324 are cores of the waveguides.

In the present embodiment, the removal operation for planarization is performed by CMP. In this operation, the silicon nitride deposited on the interlayer insulating films 3191 is not completely removed, and the remaining silicon nitride forms an insulating film 325. The insulating film 325 is a layer extending over the surfaces of the high-refractive-index members 324 and the interlayer insulating films 3191, having a thickness of about 100 to 500 nm. The insulating film 325 alleviates the damage to the wiring layers. Subsequently, a silicon oxynitride insulating film 326 is formed over the surface of the insulating film 325. This insulating film 326 is formed to a thickness of about 50 to 150 nm by plasma CVD.

After the formation of the structure shown in FIG. 4B, desired portions of the insulating films 325 and 326 will be at least partially removed, as shown in FIG. 4C. In the present embodiment, the region in the peripheral circuit section 1016 where via conductors will be formed and part of the other region are removed by etching. If a high-refractive-index film, which has a high stress, is formed over the entire surface of the semiconductor substrate, the high stress causes the semiconductor substrate to warp, or causes the high-refractive-index film to separate. This is the reason why the insulating films are partially removed. In addition, openings 329 formed by removing the region where via conductors will be formed facilitate etching that will be performed in a subsequent step. Furthermore, by forming a pattern 401 with part of the other region remaining, the flatness in the subsequent steps can be ensured. The insulating films 325 and 326 are formed into insulating films 327 and 328 in the pixel section 1011. Then, an insulating film intended as an insulating film 330 is formed so as to fill the openings 329 and cover the insulating films 327 and 328. The insulating film intended as an insulating film 330 can be formed of, for example, silicon oxide by plasma CVD. Then, a via conductor 331 is formed so as to pass through the thickness of the insulating film intended as the insulating film 330 and the thickness of the portion of the interlayer insulating films 319 overlying the second wiring layer 322. Thus, the via conductor 331 is formed, and, thus, the insulating film 330 and interlayer insulating films 332 are formed. The via conductor 331 is made of, for example, tungsten and contains a barrier metal of titanium or titanium nitride. A third wiring layer 333 is formed on the via conductor 331, and thus, the structure shown in FIG. 4C is obtained. The third wiring layer 333 is formed of a conductive material mainly containing, for example, aluminum by patterning. In the present embodiment, the third wiring layer 333 functions as a light-shielding film.

Figure 5A:
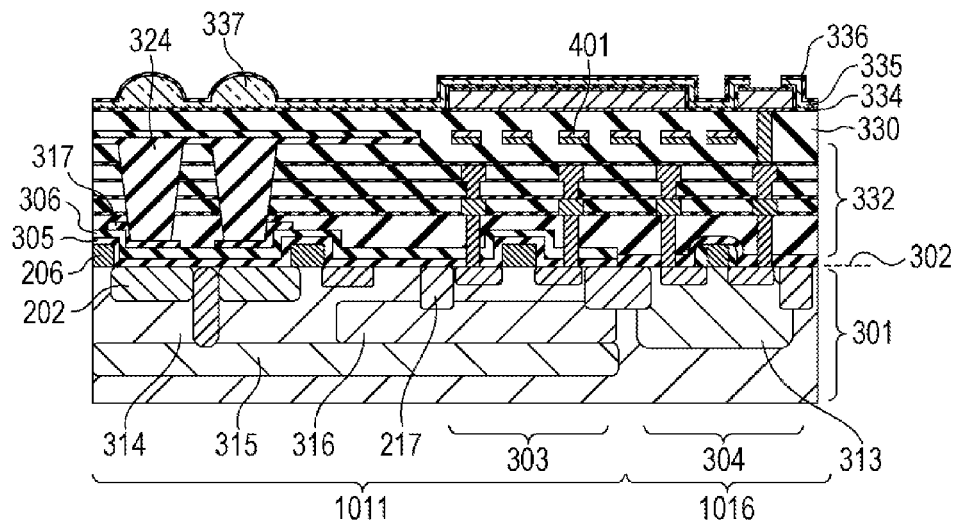
FIGS. 5A and 5B are representations of the method for manufacturing the solid-state image pickup apparatus of the first embodiment.

Then, an insulating film intended as insulating film 334 and an insulating film intended as insulating film 335 will be formed in that order on the structure shown in FIG. 4C. The insulating film intended as insulating film 334 is formed of silicon oxynitride by plasma CVD, and the insulating film intended as insulating film 335 is formed of silicon nitride by plasma CVD. Then, a photoresist layer in a shape of lenses is formed on the insulating film intended as insulating film 335, and the shape of lenses is transferred to the insulating film intended as insulating film 335 by etching using the photoresist layer as a mask. The insulating film in the shape of lenses is covered with an insulating film intended as insulating film 336. The insulating film intended as insulating film 336 is formed of silicon oxynitride by plasma CVD. The upper three insulating films are formed into insulating films 334 to 336 by removing the portions of the three insulating films corresponding to external electrode pads, and thus, the structure shown in FIG. 5A is formed. Insulating film 335 is a lens layer having in-layer lens 337, and insulating films 334 and 336 can function as antireflection films.

Figure 5B:
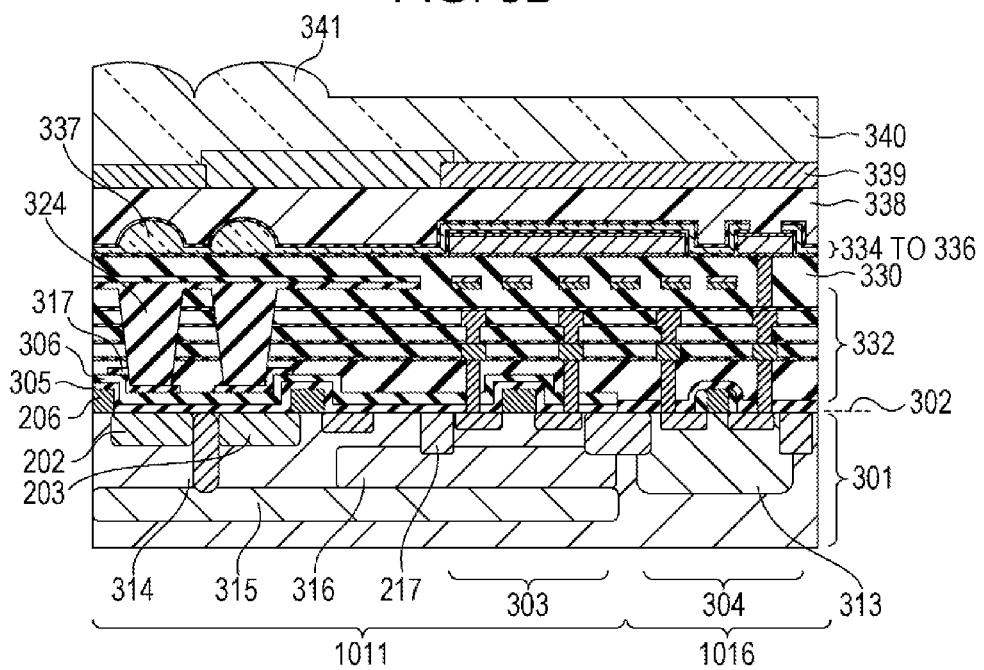

After the formation of the structure shown in FIG. 5A, a resin planarizing layer 338, a color filter layer 339 including color filters corresponding to a plurality of colors, and a micro lens layer 340 including micro lenses 341 are formed in that order, thus forming the structure shown in FIG. 5B. Thus, a solid-state image pickup apparatus can be produced through the operations described with reference to FIGS. 3A to 5B. FIGS. 3A to 5B show part of the main surface side of a semiconductor substrate 301, and color filters may not be provided if the solid-state image pickup apparatus is of three-plate type or monochromatic type.

Figure 6:
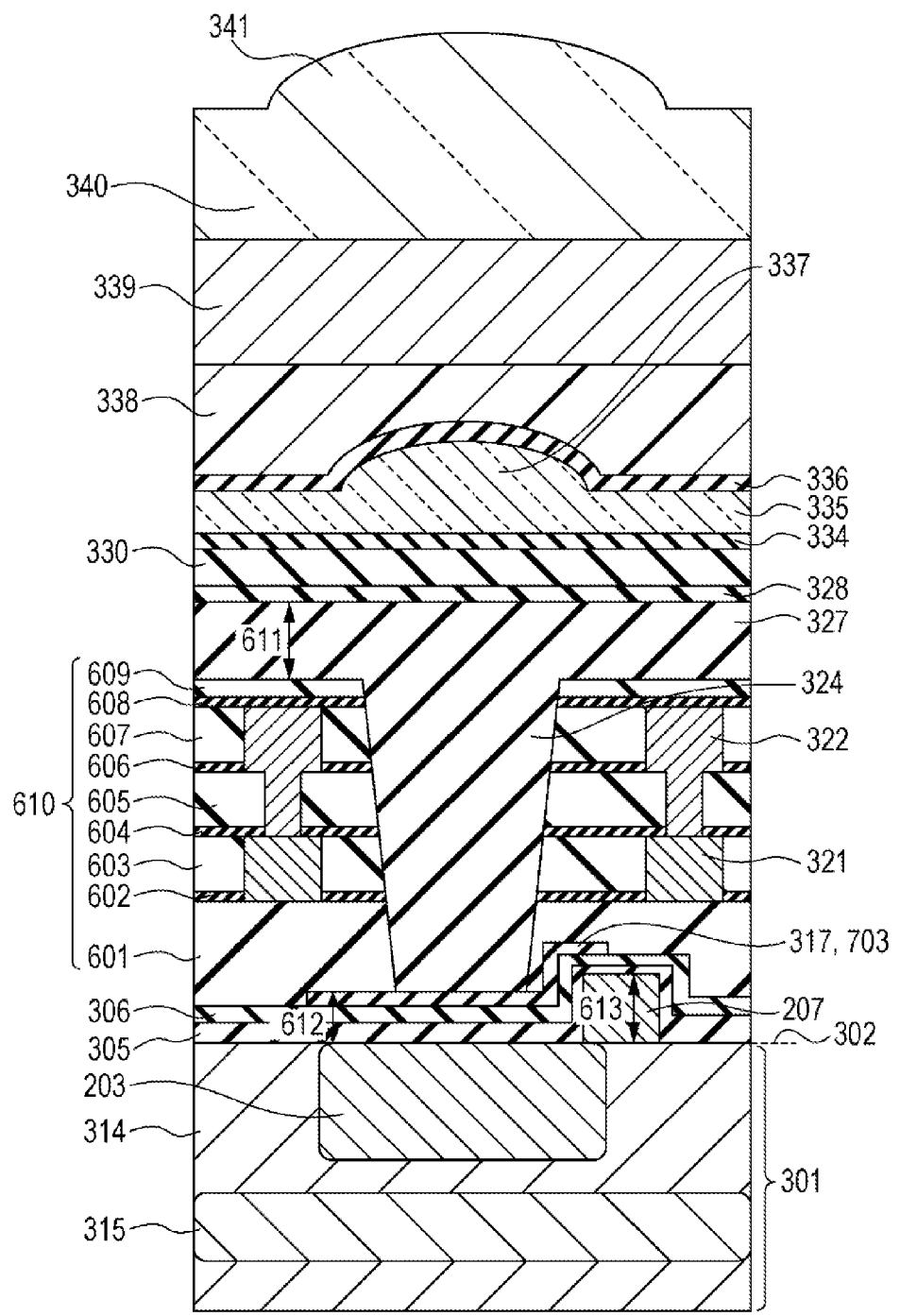
FIG. 6 is a schematic fragmentary sectional view of the solid-state image pickup apparatus of the first embodiment.

Insulating film 317 will now be described in detail with reference to FIG. 6. FIG. 6 is a fragmentary enlarged view of the solid-state image pickup apparatus shown in FIG. 5B. The same parts as in FIG. 5B are designated by the same reference numerals, and thus description thereof is omitted. The interlayer insulating films 332 shown in FIG. 5B correspond to interlayer insulating films 610 in FIG. 6, and the interlayer insulating films 610 include a plurality of insulating films 601 to 609. Insulating films 601, 603, 605, 607 and 609 are made of silicon oxide, and insulating films 602, 604, 606 and 608 are made of silicon nitride. Insulating films 604 and 608 can function as an anti-diffusion film to prevent the metal in the wiring layers 321 and 322 from diffusing. Insulating films 602 and 606 may function as etching stop films for forming a wiring layer. Insulating films 604 and 608 have larger thicknesses than insulating films 602 and 606.

Insulating film 317 (703) in FIG. 6, which corresponds to Insulating film 703 in FIG. 7, is made of silicon nitride as mentioned above. Thus, insulating film 317 and the high-refractive-index member 324, which is made of silicon nitride, are made of the same material. Consequently, reflection does not easily occur at the interface between insulating film 317 and the high-refractive-index member 324. Between insulating film 317 and the main surface 302 of the semiconductor substrate, the insulating film made of silicon oxide (not shown) and the insulating films 305 and 306 made of silicon oxide are formed in that order from the main surface 302 side. In the present embodiment, the insulating film (not shown) has a thickness of about 5 to 20 nm, insulating film 305 has a thickness of about 30 to 100 nm, insulating film 306 has a thickness of about 50 to 150 nm, and insulating film 317 has a thickness of about 30 to 100 nm. It is desirable, if possible, that the thickness of insulating film 317 be λ/2n (λ: wavelength of incident light, n: refractive index).

Even if insulating film 703 is disposed over the entire main surface 302 (except the portion where the plug portion of the contact will be formed) of the semiconductor substrate, insulating film 703 can function as an etching stop film to reduce the damage to the antireflection film. However, the sensitivity is increased by forming the insulating film in the shape of the present embodiment in comparison with the case where the insulating film is formed over the entire main surface 302 of the semiconductor substrate. For example, in the high-sensitivity wavelength range of 450 to 630 nm, the case of using insulating film 703 in the shape of the present embodiment about 1% to 5% increases the sensitivity in comparison with the case of using insulating film 703 disposed over the entire main surface 302 of the semiconductor substrate. This is probably because the insulating film disposed over the entire surface diverges light collected through the waveguide. If insulating film 703 having a higher refractive index than the insulating films acting as the clad is disposed over the entire surface, the refractive index of the clad is practically increased at the vicinity of insulating film 703, and consequently, light diverges. Also, if a continuous insulating film overlies photoelectric conversion portions from one to another, light may be mixed in the adjacent photoelectric conversion portion. Accordingly, individual insulating films 703, separate from each other, are provided corresponding to the respective photoelectric conversion portions, if possible.

In the structure shown in FIG. 6, the thickness 611 of insulating film 327 can be larger than 0 and lower than and $\lambda/n$ or less (where $\lambda$ represents the wavelength of incident light, and n represents the refractive index of insulating film 327). Insulating film 327 is disposed on the interlayer insulating films 610 acting as the clad of the waveguide, and extends over the waveguides from one high-refractive-index member 324 to the adjacent high-refractive-index member 324. In this instance, light that has diagonally entered a waveguide may enter the adjacent waveguide through insulating film 327. From the viewpoint of reducing such mixing of light, the thickness 611 can be larger than 0 and $\lambda/n$ or less. It may be advantageous to reduce the propagation of light particularly having a wavelength difficult to absorb, for example, a wavelength corresponding to red. For example, the thickness 611 can be determined on the basis of the peak wavelength of the spectral transmittance of a red color filter. In addition, the lower limit of the thickness 611 can be set in a range allowing for a process margin for planarization. Alternatively, the lower limit of the thickness 611 may be set in the range in which insulating film 327 can be used as a protective film.

Also, in FIG. 6, it may be advantageous that the total thickness of insulating films 305, 306 and 317 overlying the photoelectric conversion portion is smaller than the thickness of the gate electrode 613. In other words, the distance 613 between the main surface 302 of the semiconductor substrate and the upper surface of the gate electrode is larger than the distance 612 between the main surface 302 and the upper surface of insulating film 317 overlying the photoelectric conversion portion. This structure allows the waveguide to be disposed near the photoelectric conversion portion, and consequently can suppress the divergence of light when it enters the waveguide from below. Thus, the sensitivity of the solid-state image pickup apparatus can be enhanced.

In FIG. 6, insulating film 305, insulating film 306 in contact with insulating film 305, and insulating film 317 in contact with insulating film 306 are formed in that order over the photoelectric conversion portion. In the present embodiment, these insulating films are not planarized during the formation of these films. Accordingly, their thicknesses can be easily controlled.

Thus, by forming insulating films 701 to 704, a structure having waveguides in which reflection is reduced can be achieved. In addition, the sensitivity of the solid-state image pickup apparatus can be enhanced.

Figure 8A:
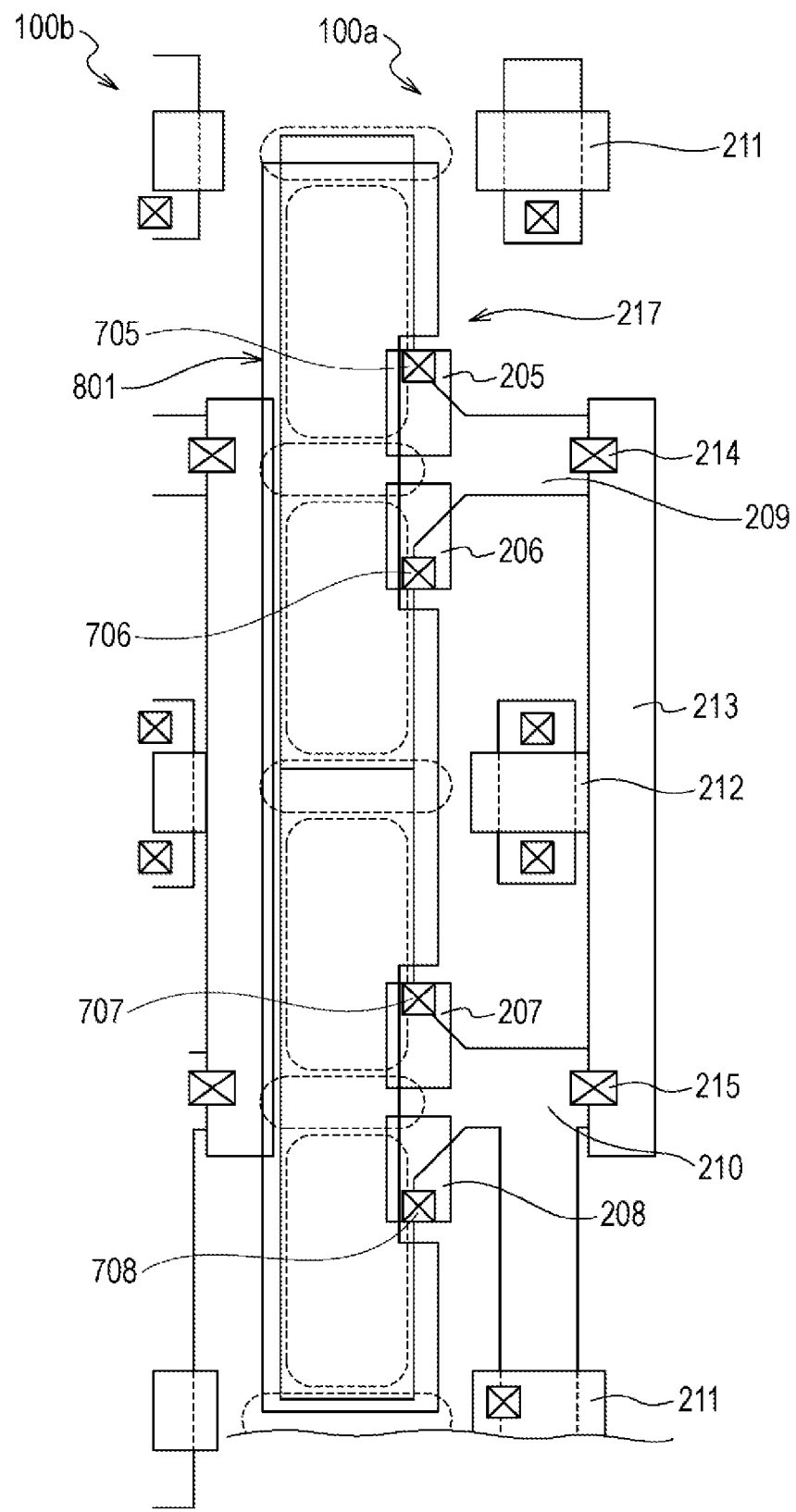
FIGS. 8A and 8B are schematic representations showing the layouts in plan view of modifications of the first embodiment.
Figure 8B:
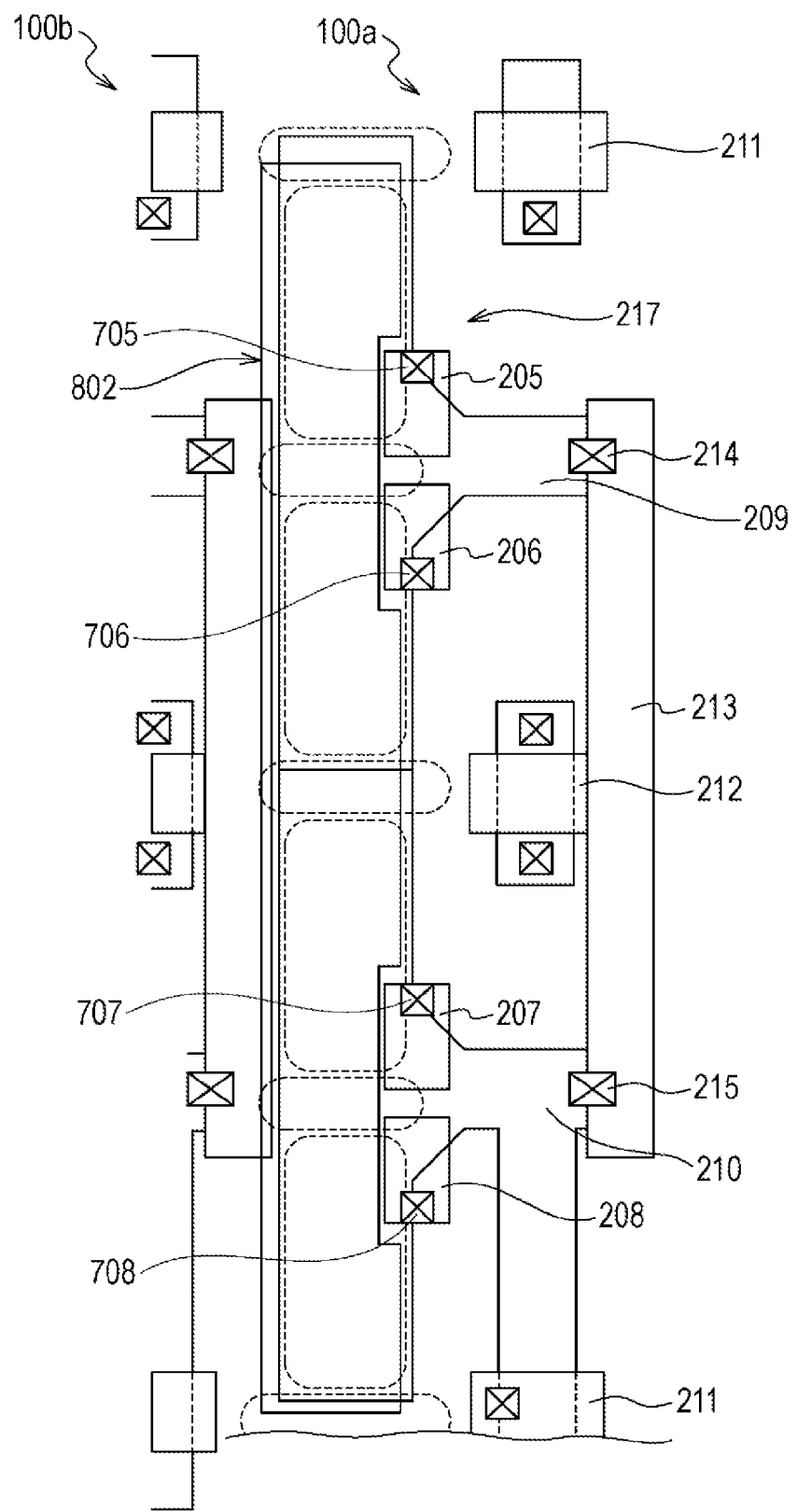

Turning now to FIGS. 8A and 8B, modifications of insulating films 701 to 704 shown in FIG. 7 will be described. FIGS. 8A and 8B show layouts in plan view corresponding to the layout shown in FIG. 7. In FIGS. 8A and 8B, the same parts as in FIG. 7 are designated by the same reference numerals, and thus description thereof is omitted.

In the modification shown in FIG. 8A, insulating films 701 to 704 of FIG. 7 are replaced with an integrated insulating film 801. Thus, the insulating film functioning as an etching stop film may not be discrete films provided one for each photoelectric conversion portion. This form of the insulating film can suppress the degradation of the function of the antireflection film. In addition, etching damage to the PDs can be reduced, and the operation for forming contacts can be facilitated. However, the structure shown in FIG. 7, in which discrete insulating films are disposed one for each photoelectric conversion portion, more suppresses the undesirable propagation of light to the adjacent pixels and enhances the sensitivity of the solid-state image pickup apparatus, as described above.

In the modification shown in FIG. 8B, insulating films 701 to 704 of FIG. 7 are replaced with an integrated insulating film 802 having a different area. The outer edge of insulating film 802, in part, overlaps with the charge storage regions 201 to 204 of the PDs when viewed from above. Also, insulating film 802 does not overlap with the gate electrodes 205 to 208 of the transfer transistors or the connection wiring line 231. This form of the insulating film can suppress the degradation of the function of the antireflection film. In addition, the operation for forming contacts can be facilitated. Insulating film 802 may be divided corresponding to each of the PDs, as shown in FIG. 7. As described above, a structure in which discrete insulating films are disposed one for each photoelectric conversion portion as shown in FIG. 7 more increases the sensitivity of the solid-state image pickup apparatus.

The area of insulating films 701 to 704 may be larger than the bottom area of the openings 323, and smaller than the area of the light-receiving surfaces of the photoelectric conversion portions. This form of the insulating film can reduce etching damage when the openings 323 are formed, and suppress the divergence of light to enhance the sensitivity.

Second Embodiment

Figure 9:
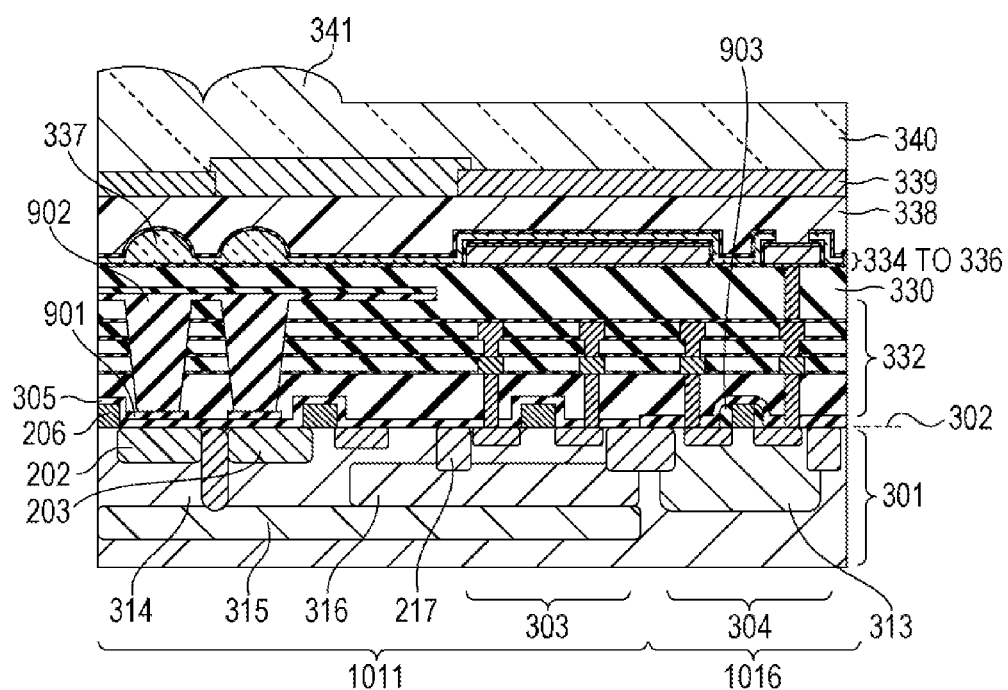
FIG. 9 is a schematic sectional view of a solid-state image pickup apparatus according to a second embodiment.

A second embodiment will now be described with reference to FIG. 9. FIG. 9 is a schematic sectional view of a solid-state image pickup apparatus and corresponds to FIG. 5B. In FIG. 9, the same parts as in FIG. 5B are designated by the same reference numerals, and thus description thereof is omitted. The second embodiment is different from the first embodiment in that insulating film 306 of the first embodiment is not provided, and in that insulating films 317 of the first embodiment are replaced with insulating film 901 having a different shape.

In FIG. 9, an insulating film made of silicon oxide (not shown), insulating films 305 and 901 are disposed over the charge storage regions 202 and 203, in that order from the main surface 302 side. Insulating film 901 corresponds to insulating film 317 in FIG. 5B. Insulating film 901 does not extend to overlap the gate electrode. Also, insulating film 901 is disposed on and in contact with the insulating film 305 made of the same material, silicon nitride. Consequently, the high-refractive-index member 902 can be disposed closer to the main surface 302 of the semiconductor substrate in comparison with the structure of the first embodiment.

The sidewalls 903 of the transistor in the peripheral circuit section 1016 include a silicon oxide layer (not shown) and a silicon nitride layer. Such a multilayer film of the sidewall 903 are the same as the multilayer structure of the insulating film made of silicon oxide (not shown) and insulating film 305 in the pixel section 1011.

In this structure, by providing insulating films 901, the degradation of the function of the antireflection film can be suppressed. In addition, by arranging insulating films 901 over the respective photoelectric conversion portions, the sensitivity of the solid-state image pickup apparatus can be enhanced. Furthermore, since insulating films 901 are disposed only over the photoelectric conversion portions, contacts can be easily formed.

Third Embodiment

In a third embodiment, the structure of an image pickup system will be described with reference to FIG. 10. FIG. 10 is a block diagram of a solid-state image pickup apparatus and an image pickup system. The image pickup system 1000 includes the solid-state image pickup apparatus 1001 and a signal processing device 1002 that receives electrical signals from the solid-state image pickup apparatus 1001 and processes the signals. More specifically, electrical signals are outputted from OUTs 1 and 2 of the solid-state image pickup apparatus 1001 and inputted to the signal processing device 1002 through IN. The signal processing device 1002 outputs signals such as image signals, driving signals, and control signals, according to the result of signal processing. The electrical signals may be current or voltage, or may be in analog or digital form. The solid-state image pickups device 1001 may be an image sensor, a focus detection sensor, or a photometric sensor, and may be used for any application. This image pickup system can produce good image signals or control signals that can be used for control.

Fourth Embodiment

The present embodiment is different from the first embodiment in the forming of openings in the interlayer insulating films. The operation for forming the openings will be described with reference to FIGS. 11A to 11D. FIGS. 11A to 11D are schematic fragmentary enlarged sectional views illustrating in detail steps performed between FIGS. 3C and 4A, showing the portion corresponding to the second PD. In FIGS. 11A to 11D, the same parts as in the other figures are designated by the same reference numerals, and thus description thereof is omitted.

Figure 11A:
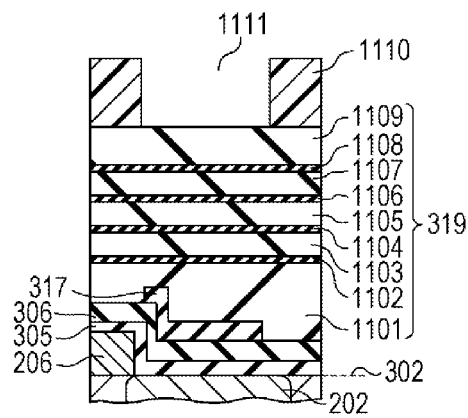
FIGS. 11A to 11D are representations of a method for manufacturing a solid-state image pickup apparatus according to a fourth embodiment.

As shown in FIG. 11A, a mask 1110 is formed after the wiring layers and the interlayer insulating films 319 are formed. The interlayer insulating films 319 include insulating films of at least two different materials that have been alternately formed one on top of another. More specifically, the interlayer insulating films 319 include, at least, a member intended as a first insulating film, a member intended as a second insulating film made of a different material from that of the first insulating film, a member intended as a third insulating film, and a member intended as a fourth insulating film made of a different material from that of the third insulating film. These insulating films have been formed in that order. In FIG. 11A, the interlayer insulating films 319 include silicon oxide insulating films 1101, 1103, 1105, 1107 and 1109 and silicon nitride insulating films 1102, 1104, 1106 and 1108 that are alternately disposed one on top of another. Insulating films 1101 to 1109 correspond to insulating films 601 to 609 shown in FIG. 6. Insulating film 1101 is the member intended as the first insulating film; insulating film 1102 is the member intended as the second insulating film; insulating film 1103 is the member intended as the third insulating film; and insulating film 1104 is the member intended as the fourth insulating film.

After forming the interlayer insulating films 319, a mask 1110 having an opening 1111 in the region corresponding to the photoelectric conversion portion is formed on the uppermost insulating film 1109 of the interlayer insulating films 319. The mask 1110 may be formed of a resist by photolithography.

Figure 11B:
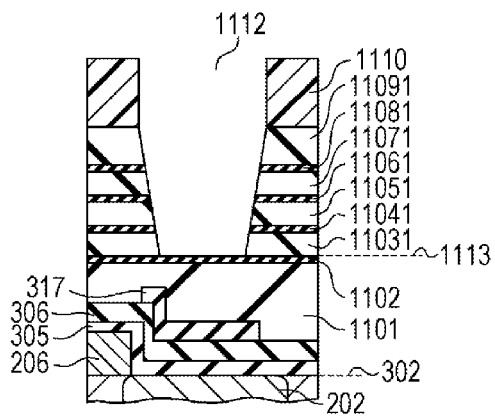

Subsequently, the portion corresponding to the opening 1111 of the interlayer insulating films 319 is removed. First, the removal is performed from insulating film 1109 by etching. For example, anisotropic etching is performed. The etching for removal is performed under the conditions in which the third and the fourth insulating film are etched at substantially the same rate so that both insulating films can be etched. In this etching operation, at least the portion corresponding to the opening 1111 of the third and fourth insulating films is removed (first removal). The first removal is performed until the second insulating film is exposed or partially removed by removing the portion of the third and fourth insulating films corresponding to the opening 1111 in the mask 1110. In other words, insulating films 1103 to 1109 are continuously etched. At the time when insulating film 1103 that is the member intended as the third insulating film has been partially removed, etching is suspended or the etching conditions are changed. At this time, part of the member intended as the third insulating film has been removed, and the member intended as the second insulating film may have been etched. The time at which the etching is suspended can be controlled by detecting the intensity of light for removing the third insulating film while plasma emission intensity is monitored, or by measuring time. For etching both an insulating film made of silicon oxide and an insulating film silicon nitride at one time, plasma etching may be performed using a mixed gas of $CHF_3$ or any other hydrogen-containing fluorocarbon gas and $C_4F_8$ or any other fluorocarbon gas, oxygen, and an inert gas, such as argon. Insulating films 1103 to 1109 are formed into insulating films 11031 to 11091 each having an opening (FIG. 11B). The opening 1112 shown in FIG. 11B is defined by the openings formed in these insulating films, communicating with one another. The bottom of the opening 1112 is at the level of plane 1113.

If the etching conditions are changed according to each of the insulating films, the tapered angle is varied depending on the etching conditions, and the resulting opening is likely to have an uneven sidewall. On the other hand, since, in the method of the present embodiment, the etching is continuously performed under constant conditions, the resulting opening can have a smooth sidewall. In addition, the first removal of the present embodiment, which is performed by etching the insulating films under constant conditions, can reduce the etching time relative to the case where the etching is performed different conditions according to each of the insulating films.

Figure 11C:
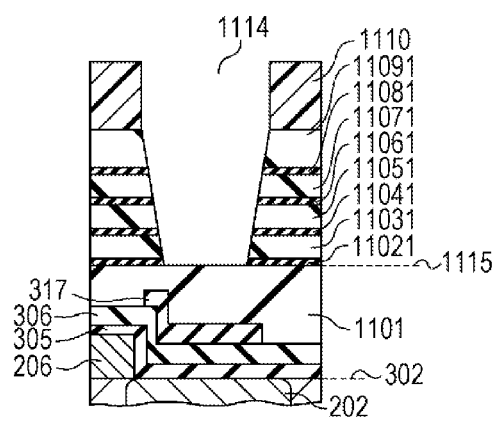

Subsequently, second removal is performed, as shown in FIG. 11C, to remove the member intended as the second insulating film under the conditions where the member intended as the second insulating film is preferentially etched to the underlying member intended as the first insulating film, that is, under the conditions where the member intended as the second insulating film has a higher etching selectivity than the member intended as the first insulating film. In other words, the etching for the second removal is performed under the conditions where the member intended as the second insulating film is etched faster than the member intended as the first insulating film. The etching conditions for the second removal can be satisfied by, for example, plasma etching using CH₂F₂ or any other hydrogen-containing fluorocarbon gas, oxygen, and an inert gas, such as argon. As shown in FIG. 11C, the portion of insulating film 1102 corresponding to the opening 1111 in the mask 1110 is removed, and thus insulating film 11021 having an opening is formed. In the above operation, the insulating film 1101 can function as an etching stop film used for removing insulating film 1102. The bottom of the opening 1114 is at the level of plane 1115 that is the upper surface of the insulating film 1101.

In the second removal, the etching rate is reduced by the presence of the member intended as the first insulating film, so that global in-plane nonuniformity in the wafer formed by the etching for the first removal can be eliminated.

Figure 11D:
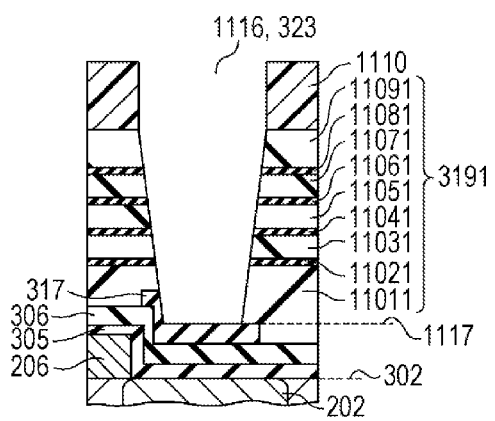

Finally, third removal is performed, as shown in FIG. 11D, by etching the exposed member intended as the first insulating film under the conditions where this member is preferentially removed to insulating film 317. Hence, etching is performed under the conditions where the member intended as the first insulating film is etched faster than the insulating film 317, that is, under the conditions where the member intended as the first insulating film has a higher etching sensitivity than insulating film 317. For example, anisotropic plasma etching may be performed using C₄F₆ or any other fluorocarbon gas, oxygen, and an inert gas, such as argon. As shown in FIG. 11D, the portion of insulating film 1101 corresponding to the opening 1111 in the mask 1110 is removed, and thus insulating film 11011 having an opening is formed. In the above operation, insulating film 317 can function as an etching stop film used for removing insulating film 1101, as in other embodiments. Then, the mask 1110 is removed. Thus, an opening 1116, that is, the multilayer insulating film 3191 having the opening 323 shown in FIG. 4A, is completed. Subsequently, the opening is filled as shown in FIG. 4B. The bottom of the opening 1116 is at the level of plane 1117.

By the technique for forming an opening of the present embodiment, the opening can be formed in a controlled shape, and in-plane nonuniformity in the wafer formed by etching can be reduced. In addition, etching damage can also be reduced.

Fifth Embodiment

Figure 12:
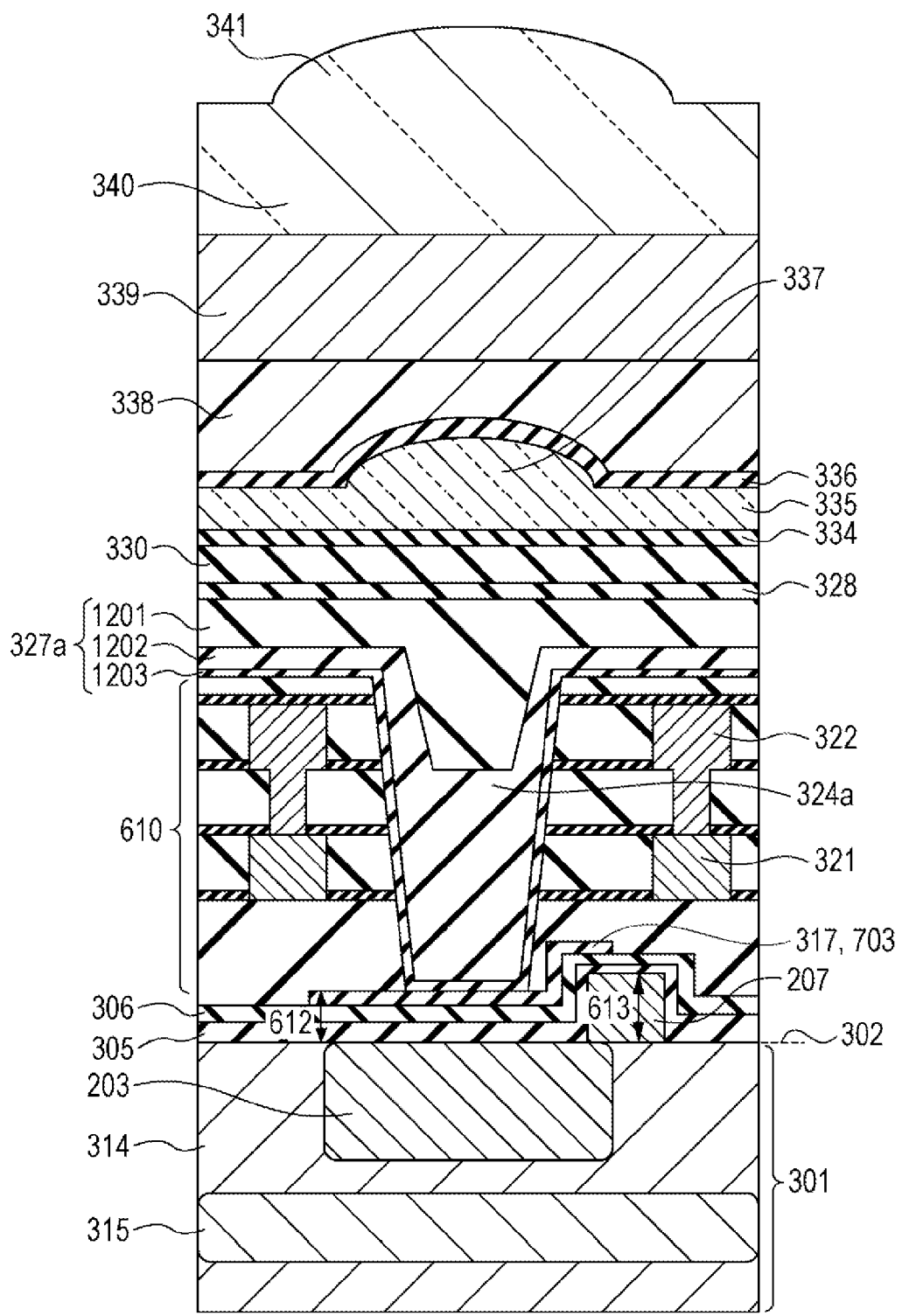
FIG. 12 is a schematic fragmentary sectional view of a solid-state image pickup apparatus according to a fifth embodiment.
Figure 13A:
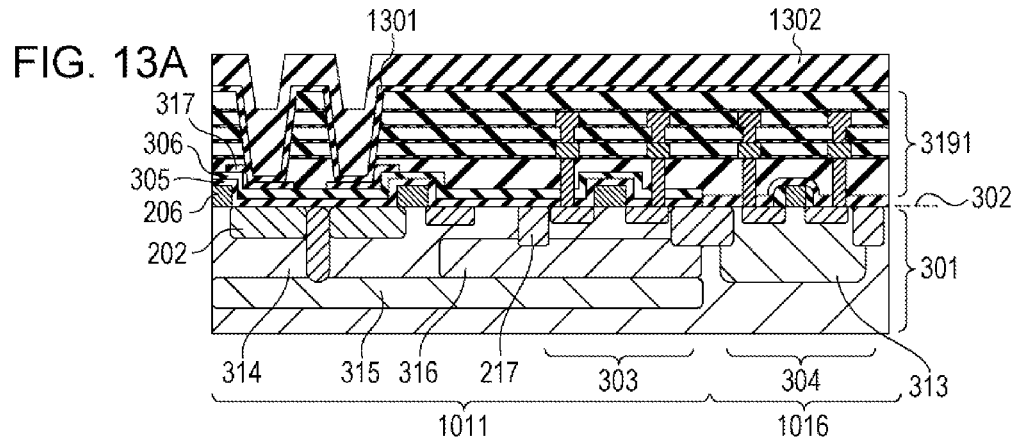
FIGS. 13A to 13C are representations of a method for manufacturing the solid-state image pickup apparatus of the fifth embodiment.
Figure 13B:
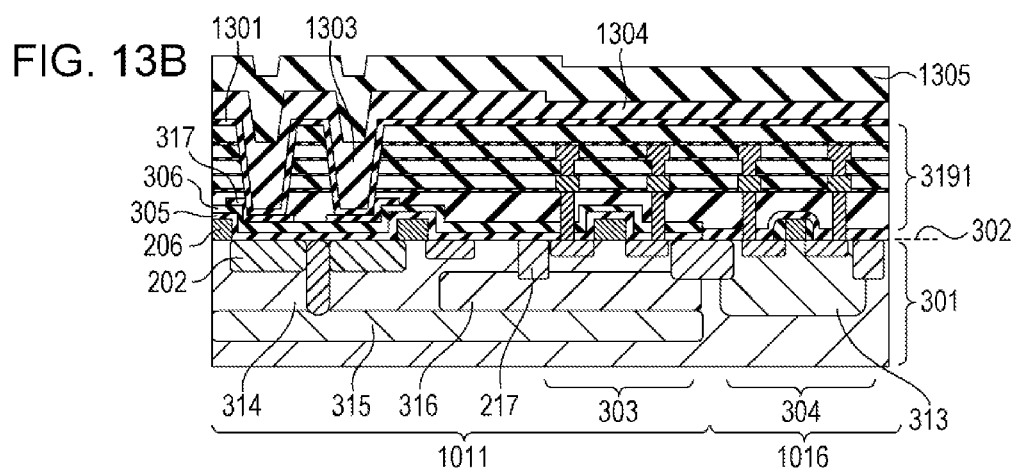
Figure 13C:
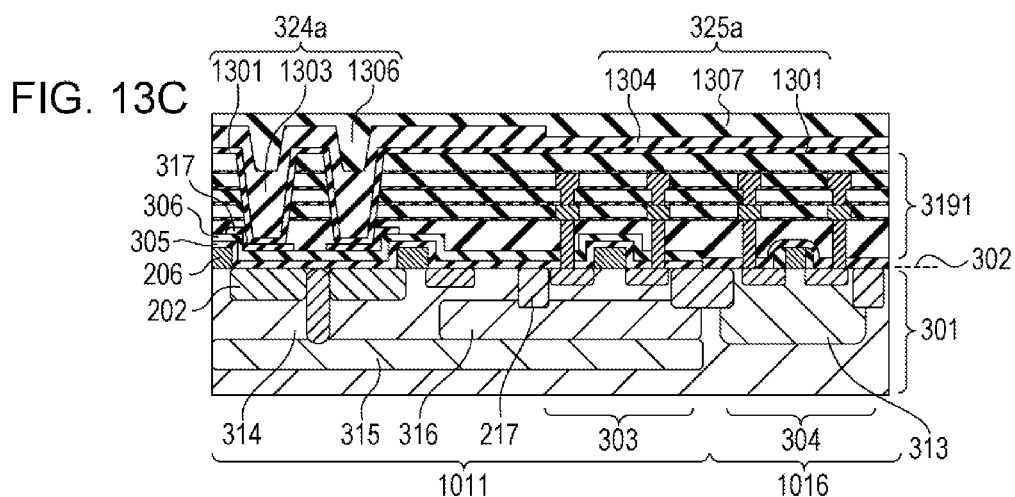

The present embodiment is different from the first embodiment in the forming of the high-refractive-index film 324 and the insulating film 327. This will now be described with reference to FIGS. 12 and 13A to 13C. FIG. 12 is a schematic fragmentary enlarged sectional view, corresponding to FIG. 6, and the high-refractive-index member 324 and the insulating film 327 in FIG. 6 correspond to a high-refractive-index member 324a and an insulating film 327a, respectively. FIGS. 13A to 13C are schematic sectional views illustrating an operation for forming the structure shown in FIG. 12, showing a modification of the process step shown in FIG. 4B. In FIGS. 12 and 13A to 13C, the same parts as in FIGS. 6 and 4B and other figures are designated by the same reference numerals, and thus description thereof is omitted.

In FIG. 12, the high-refractive-index member 324a and the insulating film 327a each include three members: a first member 1203, a second member 1202, and a third member 1201. Each member is made of silicon nitride, but is formed by different method at a different timing. Details will be described with reference to FIGS. 13A to 13C.

In FIG. 13A, insulating film 1301 intended as the first member, and subsequently insulating film 1302 intended as the second member have been formed on the structure shown in FIG. 4A. The second step of forming the second member is performed under the conditions in which the ratio of the sputtering effect to the deposition effect is higher than that in the first step of forming the first member. Insulating films 1301 and 1302 are disposed over the region from the pixel section 1016 to the peripheral circuit section 1016. Insulating film 1301 is formed by high density plasma CVD having a deposition effect and a sputtering effect under the conditions where a high frequency power is applied only to the upper electrode so as to increase the deposition effect. Insulating film 1302 is formed by high density plasma CVD under the conditions where a high frequency power is applied to both the upper electrode and the lower electrode to increase the sputtering effect. Consequently, insulating film 1301 has a high adhesion with the sidewall of the opening, and insulating film 1302 can easily fill the opening. Thus, the occurrence of voids can be reduced. In addition, insulating film 1302 has a lower stress than insulating film 1301. Accordingly, the occurrence of the deformation of the wafer can be reduced. The high frequency power of the lower electrode is set to 0 to 5000 W, and the high frequency power of the upper electrode is set to 1000 to 7000 W. For forming insulating film 1301, the lower electrode is set at a high frequency power of 0 W in the present embodiment, and the high frequency power ratio of the lower electrode to the upper electrode can be lower than that in the case of forming insulating film 1302. For forming insulating films 1301 and 1302, a mixed gas containing a silicon-containing gas, nitrogen, a nitrogen-containing gas, and an inert gas is used. The silicon-containing gas may be silane, TEOS, trimethylsilane, tetramethylsilane, or the like. The nitrogen-containing gas may be ammonia, and the inert gas may be argon, helium, or the like. In the present embodiment, both the insulating films 1301 and 1302 are formed using a mixed gas containing silane, nitrogen, ammonia, and argon. The proportion of the inert gas in the mixed gas for forming insulating film 1301 may be lower than that in the mixed gas for forming insulating film 1302. The deposition effect and the sputtering effect in the high-frequency plasma CVD can be appropriately adjusted by, for example, varying the high-frequency power or the proportions of component gases in the mixed gas. The first member and the second member of the resulting high-refractive-index member may be integrated. In addition, a third step may be performed at a high-frequency power ratio of the lower electrode to the upper electrode between those in the first step and the second step. In other words, when the first step is changed to the second step, the steps may be changed under continuous conditions by, for example, performing the third step between the first and second steps.

In FIG. 13B, the thickness of insulating film 1302 in the peripheral circuit section 1016 is reduced to form insulating film 1303 and insulating film 1304. This can be performed by anisotropic plasma etching through a mask covering the pixel section 1011. Then, insulating film 1305 intended as a third member is formed. Insulating film 1305 is disposed over the region from the pixel section 1016 to the peripheral circuit section 1016. Insulating film 1305 is formed under the same conditions as Insulating film 1302.

Then, as shown in FIG. 13C, the upper surface of insulating film 1305 is planarized by, for example, CMP so as to remove undesired portions of the insulating film, thus forming insulating film 1306 and insulating film 1307. Thus, a high-refractive-index member 324a including the first to third members, and the insulating film 325a are formed. In FIG. 13C, insulating film 1301 corresponds to the first member 1203 in FIG. 12; insulating films 1303 and 1304 correspond to the second member 1202 in FIG. 12; and insulating films 1306 and 1307 correspond to the third member 1201 in FIG. 12.

This method can form a high-refractive-index member having a high adhesion with the sidewall of the opening, reducing voids in the high-refractive-index member.

In the present embodiment, the formation of the first to third members is performed by high-density plasma CVD under the conditions where the deposition speed of the films intended as the first to third members satisfies a specific relationship. More specifically, the conditions are such that the deposition speed in the vertical direction from the bottom of the opening 323 in FIG. 4A to the main surface 302 is 1.5 to 10 times the deposition speed from the side surface of the opening 323 in FIG. 4A in the direction parallel to the main surface 302. Waveguides can be formed without forming voids under such conditions.

Sixth Embodiment

Figure 14:
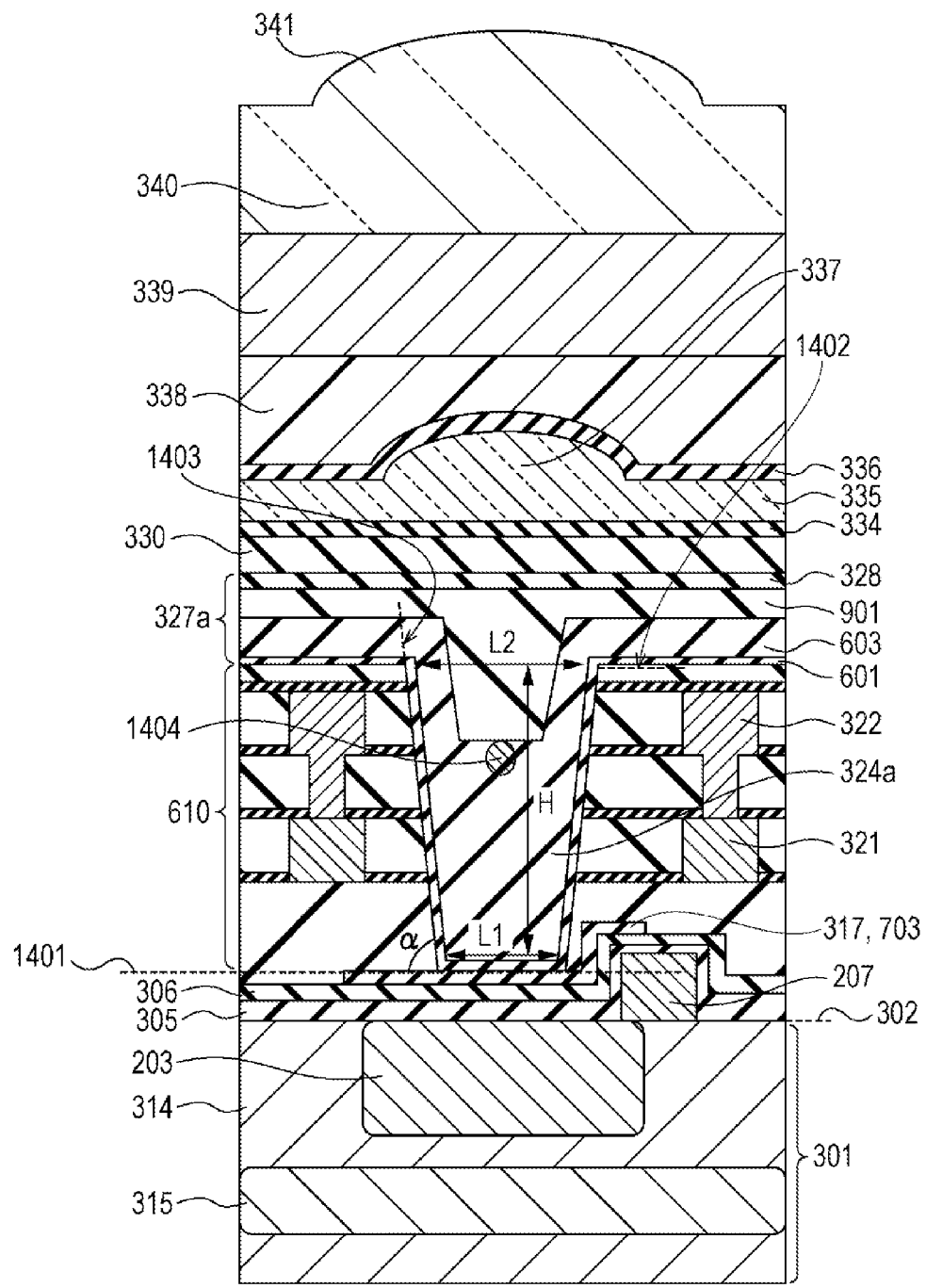
FIG. 14 is a schematic fragmentary sectional view of a solid-state image pickup apparatus according to a sixth embodiment.

In a sixth embodiment, the shape of the high-refractive-index member of the waveguide will be described with reference to FIG. 14. FIG. 14 is a fragmentary sectional view corresponding to FIG. 12. The same parts in FIG. 14 as in FIG. 12 and other figures are designated by the same reference numerals, and thus description thereof is omitted.

In FIG. 14, the shape of the high-refractive-index member 324a of the waveguide is defined by the opening 323 shown in FIG. 4A, which has a bottom surface, a top, and a side surface. Plane 1401 is a plane including the bottom surface of the opening 323, plane 1402 is a plane including the top of the opening 323, and plane 1403 is a plane including the side surface of the opening. Planes 1401 and 1402 are parallel to the main surface 302, including the light-receiving surface of the photoelectric conversion portion, of the semiconductor substrate. The largest width of the bottom of the opening is L1; the largest width of the top of the opening is L2; the line segment between planes 1401 and 1402, or between the top and the bottom, is height H; and plane 1403 and plane 1401 form an angle α. Height H is vertical to the main surface 302 of the semiconductor substrate. The shape of the high-refractive-index member 324a satisfies the relationships L1<L2, H/L2≤2, and 72.8°<α<90°. In this shape, the high-refractive-index member 324a can be formed without forming voids.

In addition, the focus 1404 of the lens system including a microlens 341 and an in-layer lens 334 lies within height H and at a higher position than the position of H/2. This structure certainly collects light to the high-refractive-index member, or collects light to the high-refractive-index member in a sense of wave optics, thus enhancing the sensitivity of the solid-state image pickup apparatus.

Seventh Embodiment

Figure 15A:
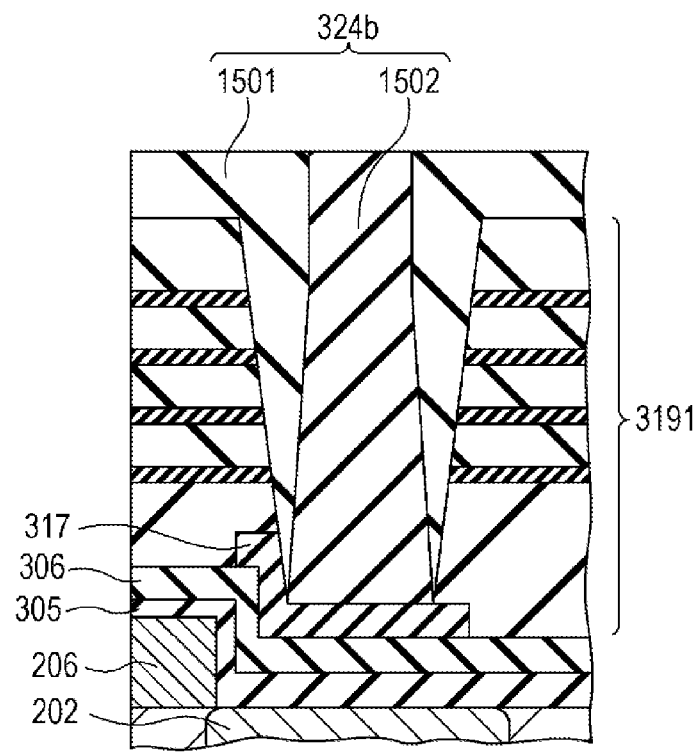
FIGS. 15A and 15B are each a schematic fragmentary sectional view of a solid-state image pickup apparatus according to a seventh embodiment.
Figure 15B:
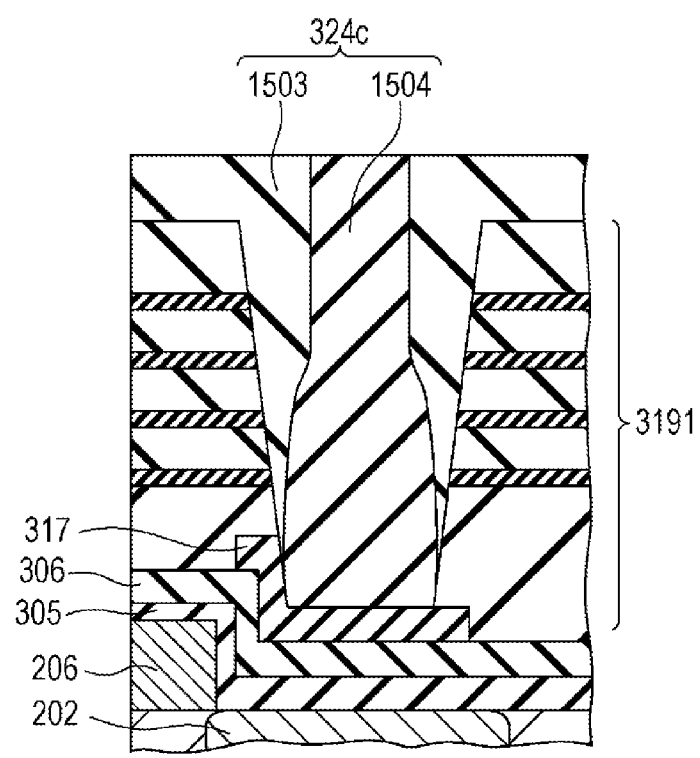

In a seventh embodiment, the shape of the high-refractive-index member of the waveguide will be described with reference to FIGS. 15A and 15B. FIGS. 15A and 15B are fragmentary sectional views corresponding to FIG. 6. The same parts as in FIG. 6 and other figures are designated by the same reference numerals, and thus description thereof is omitted.

The high-refractive-index member 324b shown in FIG. 15A has a first portion 1501 and a second portion 1502. The high-refractive-index member 324c shown in FIG. 15B has a first portion 1503 and a second portion 1504. In each structure, the first portion 1501 and 1503 covers the sidewall of the opening 323. The second portion 1502 and 1504 is surrounded by the first portion 1501 and 1503. The second portions 1502 and 1504 have shapes whose lower surface has a larger area (in the direction parallel to the main surface 302 of the semiconductor substrate) than the upper surface. In other words, the thickness of the first portion is increased at the upper side of the waveguide. Also, the refractive indexes of the first portions 1501 and 1503 are higher than those of the second portions 1502 and 1504, respectively. Since light is collected to a region having a higher refractive index, light coming into the waveguide and light coming from oblique directions are collected to the first portion, and, thus, the sensitivity is increased. In addition, since the second portion is surrounded by the first portion, light coming through the sidewall of the opening can be efficiently propagated to the center of the high-refractive-index member, and, thus, the sensitivity can be increased.

Eighth Embodiment

An eighth embodiment describes a solid-state image pickup apparatus having the same waveguides as in the first embodiment. In the eighth embodiment, however, transistors in the peripheral circuit section work at different voltages from the transistors of the first embodiment. More specifically, a transistor that can work at a high voltage of, for example, 3.3 V or 2.5 V, and a transistor that can work at a low voltage of, for example, 1.8 V or 1.0 V are used in the peripheral circuit section. The method for manufacturing the solid-state image pickup apparatus of the present embodiment will be described with reference to FIGS. 16A to 19B, and the structure of the solid-state image pickup apparatus of the present embodiment will be described with reference to FIGS. 20A and 20B. In FIGS. 16A to 19B, the same parts as in other embodiments are designated by the same reference numerals, and thus description thereof is omitted. The reference numerals used in FIGS. 16A to 19B are mutual among these figures.

FIG. 16A shows the pixel section 1011 and the peripheral circuit section 1016. The peripheral circuit section 1016 includes a low-voltage N-type transistor forming region 1601, a low-voltage P-type transistor forming region 1602, a high-voltage N-type transistor forming region 1603, and a high-voltage P-type transistor forming region 1604.

Element isolation regions having a shallow trench isolation (STI) structure are formed in the pixel section 1011 and the peripheral circuit section 1016. When the element isolation regions are formed, semiconductor regions 1609 to reduce noise from defects at the interfaces of the element isolation regions are formed only in the pixel section 1011. The semiconductor regions can be of the type in which signal charges act as minority carriers, and, in the present embodiment, P-type semiconductor regions are formed. Then, P-type wells 1605 and 1606 and N-type wells 1607 and 1608 are formed in the peripheral circuit section 1016. In a subsequent step, a low-voltage N-type transistor will be formed in P-type well 1605, and a high-voltage N-type transistor will be formed in P-type well 1606. Also, a low-voltage P-type transistor will be formed in N-type well 1607, and a high-voltage P-type transistor will be formed in N-type well 1608. Then, P-type semiconductor regions 315 and 316 are formed in the pixel section 1011.

Subsequently, an N-type semiconductor region that will act as a charge storage region of the photoelectric conversion portion 1611 is formed. Then, a gate insulating film 1610 is formed over the main surface 302 of the semiconductor substrate 301 (FIG. 16B). The gate insulating film 1610 may be a silicon oxide film formed by thermal oxidation, a silicon oxynitride film formed by plasma nitridation of the silicon oxide film, or a film formed by depositing silicon nitride. In the present embodiment, the gate insulating film 1610 is formed of silicon oxynitride. The silicon oxynitride gate insulating film 1610 suppresses the contamination of the semiconductor substrate with impurities from the gate electrode or the like. The gate insulating film 1610 may have some thicknesses. More specifically, the gate insulating film 1610 has a first thickness in the pixel section 1011, the high-voltage N-type transistor forming region 1603, and the high-voltage P-type transistor forming region 1604. Also, the gate insulating film 1610 has a second thickness in the low-voltage N-type transistor forming region 1601 and the low-voltage P-type transistor forming region 1602. The first thickness is larger than the second thickness. This is because the region of the gate insulating film 1610 having the first thickness will be provided with circuits that work at a higher voltage than circuits that will be disposed in the region of the gate insulating film 1610 having the second thickness. Also, the portion of the gate insulating film 1610 overlying the PD has the first thickness. Thus, damage to the PD can be reduced.

Subsequently, a material layer intended as a gate electrode is formed over the gate insulating film 1610. Although, in the present embodiment, the material layer may be formed of polysilicon, other materials may be used in another embodiment. In the present embodiment, impurity ions are implanted in the material layer to form a P-type polysilicon film 1612 and an N-type polysilicon film 1613. The polysilicon film lying in the region where a P-type transistor will be formed is the P-type polysilicon film 1612, and the polysilicon film lying in the region where an N-type transistor will be formed is the N-type polysilicon film 1613. From the viewpoint of enhancing the performance of the transistors in the peripheral circuit section 1016, the material layer can be divided into an N-type and a P-type polysilicon films if surface channel type transistors are formed. Then, an insulating film 1614 covering both types of polysilicon is formed (FIG. 16C). The insulating film 1614 is formed of silicon oxide. Alternatively, the insulating film 1614 may be formed of silicon nitride or the like.

Then, a photoresist pattern (not shown) is formed on the insulating film 1614, and the insulating film 1614 is etched to form insulating members. The insulating members include first insulating members 1708 disposed in the pixel section 1011, and second insulating members 1709 disposed in the periphery circuit section 1016. After removing the photoresist pattern (not shown), the P-type polysilicon films 1612 and the N-type polysilicon films 1613 are etched using the first insulating members 1708 and the second insulating members 1709 as a mask. Subsequently, gate electrodes 1701 to 1707 are formed (FIG. 17A). In FIG. 17A, the pixel section 1011 has the gate electrode 1701 of a transfer transistor, the gate electrode 1702 of an amplification transistor, and the gate electrode 1703 of a transistor of a pixel cell. To be precise, the gate electrode 1702 of the amplification transistor shown in FIG. 17A is the portion of the gate electrode extending as a wiring line. In FIG. 17A, the peripheral circuit section 1016 has the gate electrode 1704 of the low-voltage N-type transistor, the gate electrode 1705 of the low-voltage P-type transistor, the gate electrode 1706 of the high-voltage N-type transistor, and the gate electrode 1707 of the high-voltage P-type transistor. The first insulating members 1708 and the gate electrodes have a one-to-one correspondence, and the side surface of each first insulating member 1708 can be flush with the side surface of the corresponding gate electrode. The second insulating members 1709 and the gate electrodes also have a one-to-one correspondence, and the side surface of each second insulating member 1709 is flush with the side surface of the corresponding gate electrode. The gate electrodes in the pixel section 1011 are covered with the first insulating members 1708. This structure can suppress the implantation of ions to the gate electrodes when ion implantation is performed in a subsequent step. Accordingly, the performance variation among gate electrodes can be reduced. In the structure shown in FIG. 17A, the gate insulating film is omitted, but is present on the main surface 302 of the semiconductor substrate. Similarly, the gate insulating film is omitted in FIGS. 17A to 19B.

Subsequently, as shown in FIG. 17B, semiconductor regions are formed for forming the source/drain regions of the transistors. For the transfer transistor, an FD region 1711 acting as the drain region is formed. At this time, a P-type semiconductor region 1712 is formed between the FD region 1711 and the charge storage region 1611 of the PD. The P-type semiconductor region 1712 functions as a potential barrier for enabling the transfer transistor to operate. Also, the P-type semiconductor region 1712 has a function of so-called punch through stop. Then, a P-type semiconductor region 1710 is formed to cover the charge-storage region 1611. The P-type semiconductor region 1710 functions as a surface protection region that protects the charge storage region 1611 from dark current that arises at the surface of the semiconductor substrate 301. For other transistors, semiconductor regions part of which will act as source/drain regions are formed in FIG. 17B. In these semiconductor regions, at least either the source regions or the drain regions of the resulting transistors have a low impurity concentration. In addition, for the low-voltage transistors, semiconductor regions having a conductivity type opposite to the source and drain regions are formed to suppress punch-through under the region where the source and drain regions will be formed. For an N-type transistor, the conductivity type of the semiconductor region that will act as part of the source and drain regions of the transistor is N type. For a P-type transistor, the conductivity type of such a semiconductor region is P type. These semiconductor regions can be formed by, for example, by ion implantation, and description in detail is omitted. In order to enhance reliability, the ion concentration in the semiconductor region that will act as part of the source and drain regions may be varied.

Subsequently, as shown in FIG. 17C, an insulating film 1713 and spacers 1714 are formed. The insulating film 1713 is formed only in the pixel section 1011. The material and the thickness of the insulating film 1713 are selected so that it can function as an antireflection film. The spacers 1714 are formed on the sidewalls of the gate electrodes of the transistors in the peripheral circuit section 1016. The insulating film 1713 has a multilayer structure in which a silicon nitride layer is formed on a silicon oxide layer, and the spacers 1714 have a multilayer structure in which a silicon nitride layer is formed on a silicon oxide layer. It can be said that the spacer 1714 provides a structure in which a silicon oxide member is disposed between a silicon nitride member and the gate electrode. For forming the insulating film 1713 and the spacers 1714, a silicon nitride layer is formed by CVD after forming a silicon oxide layer by CVD so as to cover the gate insulating film on the main surface 302, the first insulating members 1708 and the second insulating members 1709 in the state shown in FIG. 17B. Then, a photoresist pattern covering the pixel section 1011 is formed. Anisotropic etching is performed from the pixel section 1011 to the peripheral circuit section 1016 using the photoresist pattern as a mask, thus removing the portion including the silicon oxide layer and the silicon nitride layer in the peripheral circuit section 1016. The spacers 1714 made of a film including a silicon oxide layer and a silicon nitride layer are formed in contact with the side surfaces of the gate electrodes in the peripheral circuit section 1016, and thus the structure as shown in FIG. 17C is formed. In the method of the present embodiment, since the insulating film 1713 and the spacers 1714 are formed using the same film, the number of process steps can be reduced. If only the spacers 1714 are provided, PDs can be damaged by etching the insulating film overlying the PDs for forming the spaces 1714. However, since the insulating film 1713 and the spacers 1714 are formed with the same film, damage to the PDs can be reduced.

In FIG. 18A, part of the source and drain regions of each transistor will be formed in the peripheral circuit section 1016. A photoresist pattern is formed to expose the regions in which the gate electrode and the source and drain regions of the high-voltage N-type transistor will be formed. At the same time, a photoresist pattern is formed to expose the regions in which the gate electrode and the source and drain regions of the low-voltage N-type transistor will be formed. Then, ions as N-type impurities are implanted to form the source/drain regions 1803 and 1801. Subsequently, a photoresist pattern is formed to expose the regions in which the gate electrode and the source and drain regions of the high-voltage P-type transistor will be formed. At the same time, a photoresist pattern is formed to expose the regions in which the gate electrode and the source and drain regions of the low-voltage P-type transistor will be formed. Then, ions as P-type impurities are implanted to form the source/drain regions 1802 and 1804. In this step, semiconductor regions having a higher impurity concentration than the semiconductor regions in which the source and drain regions have been formed in the step shown in FIG. 17B. These semiconductor regions form transistors having a lightly doped drain (LDD) structure. This step does not form any semiconductor region having a high impurity concentration for transistors in the pixel section 1011. Thus, the dynamic range of, for example, the amplification transistor can be increased.

Subsequently, an insulating film 1806 covering the pixel section 1011 will be formed. The insulating film 1806 is formed of, for example, silicon oxide. A silicon oxide film is formed so as to cover the pixel section 1011 and the peripheral circuit section 1016 by CVD, and a photoresist pattern covering mainly the pixel section 1011 is formed. The portion of the silicon oxide film not covered with the photoresist pattern is partially removed by anisotropic etching of the silicon oxide film using the photoresist pattern as a mask. In this instance, the photoresist pattern is provided so as to cover the region where silicide will not be formed, that is, in such a manner that the silicon oxide film remains in the region where silicide will not be formed. At this time, in the regions not covered with the photoresist pattern, for example, in the peripheral circuit section 1016, the source and drain regions and the gate electrodes are exposed.

After the formation of the insulating film 1806, silicide regions 1807 will be formed. The silicide regions 1807 are formed of, for example, cobalt silicide. Silicide regions may be formed of tungsten silicide, titanium silicide, or any other silicide. For forming the silicide regions 1807, a metal film is formed of cobalt so as to cover the insulating film 1806 in the pixel section 1011 and the source and drain regions and gate electrodes in the peripheral circuit section 1016. The metal film can be formed by, for example, sputtering. After the formation of the metal film, heat treatment is performed so that the metal can react with silicon (including polysilicon) to produce silicide. At this time, the metal film comes in contact with the source and drain regions and the gate electrodes in the peripheral circuit section 1016 because the surfaces of these source and drain regions and gate electrodes have been exposed by the operation for forming the insulating film 1806. After the heat treatment, unreacted metal is removed by etching, and thus, the structure shown in FIG. 18B is formed. The pixel section 1011 is not provided with a silicide region. This structure suppresses the diffusion of metal such as cobalt, and consequently, leakage current in the PDs and noise to signals (so-called white defects) of the PDs can be reduced. The pixel section 1011 in a structure may be provided with a silicide region, or the peripheral circuit section 1016 in a structure may not be provided with the silicide regions.

Subsequently, as shown in FIG. 19A, insulating films 1901 and 1902 will be formed. The insulating films 1901 and 1902 have a multilayer structure including a silicon oxide layer and a silicon nitride layer formed on the silicon oxide layer. The insulating film 1901 is provided corresponding to the PDs, as in the first embodiment. The insulating film 1902 is formed so as to cover the transistors and cover the silicide regions. The insulating film 1902 may function as etching stop film when contact holes are formed. The insulating film 1901 is formed so as to cover the gate electrodes. This structure can prevent the gate electrodes to be removed by etching performed in a subsequent step. In addition, since the insulating films 1901 and 1902 are formed of the same film, the number of steps can be reduced, and damage can be reduced relative to the case where they are formed of different films.

Then, a film intended as an insulating film 1905 as shown in FIG. 19B is formed, and contact holes are formed by etching the film intended as the insulating film 1905 so as to remove part of the film intended as the insulating film 1905. Metal plugs are formed in the contact holes, and, thus, the structure shown in FIG. 19B is formed. The insulating film 1905 may be made of a film formed of silicon oxide by CVD. The plugs 1903 in the pixel section 1011 and the plugs 1904 in the peripheral circuit section 1016 may contain titanium acting as a barrier metal, and titanium nitride and tungsten. When etching is performed to form the contact holes, the insulating film 1713 in the pixel section 1011 and the insulating films 1807 in the peripheral circuit section 1016 function as etching stop films. This etching is performed under the conditions where the etching rate of the silicon oxide of the insulating film 1905 becomes higher than the etching rate of the silicon nitride of the insulating films 1713 and 1807. When the surfaces of the insulating films 1713 and 1807 have been exposed, the etching conditions are changed, and the insulating films 1713 and 1807 are removed. Damage to the semiconductor substrate 301 can be reduced by forming the contact hole as above.

In the present embodiment, the etching stop film formed in the pixel section 1011 and the etching stop film formed in the peripheral circuit section 1016 are different. By using different films, the thicknesses of the etching stop films can be set independently for the pixel section 1011 and the peripheral circuit section 1016. Consequently, both high optical properties and high electrical characteristics can be achieved.

The insulating film 1902 is formed so as not to come in contact with the plugs 1903 in the pixel section 1011. If, in the pixel section 1011 where plugs 1903 will be formed, the insulating film 1902 extends over the insulating film 1713 that will act as an etching stop film in the pixel section 1011, two etching stop films are provided. This increases the number of times of changing etching conditions, and makes it difficult to control the shape of contact holes. Furthermore, the presence of such a double layer structure increases the thickness of the insulating film 1905 covering the double layer structure. Accordingly, the insulating film 1902 is formed so as not to come in contact with the plugs 1903 in the pixel section 1011, and thus the characteristics of the resulting solid-state image pickup apparatus can be enhanced.

Then, wiring lines, waveguides as shown in the first embodiment or any other embodiment, and color filters are formed in a conventional semiconductor process, and thus a solid-state image pickup apparatus is completed.

Figure 20A:
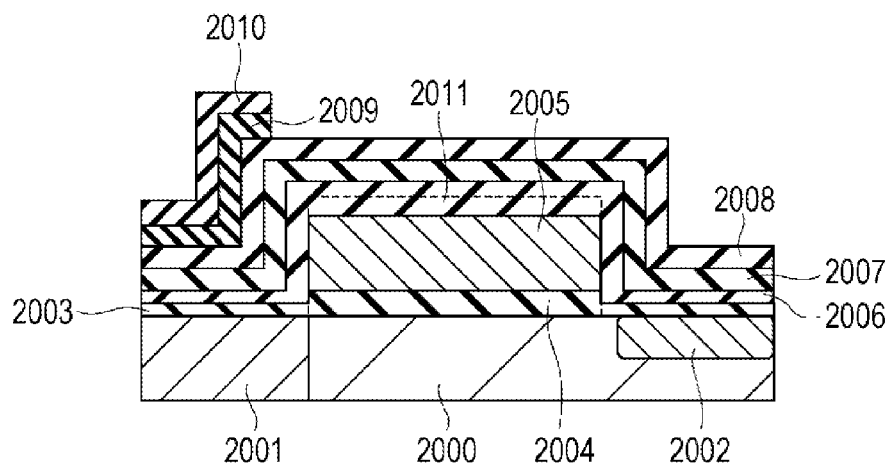
FIGS. 20A and 20B are schematic fragmentary sectional views of the solid-state image pickup apparatus of the eighth embodiment.
Figure 20B:
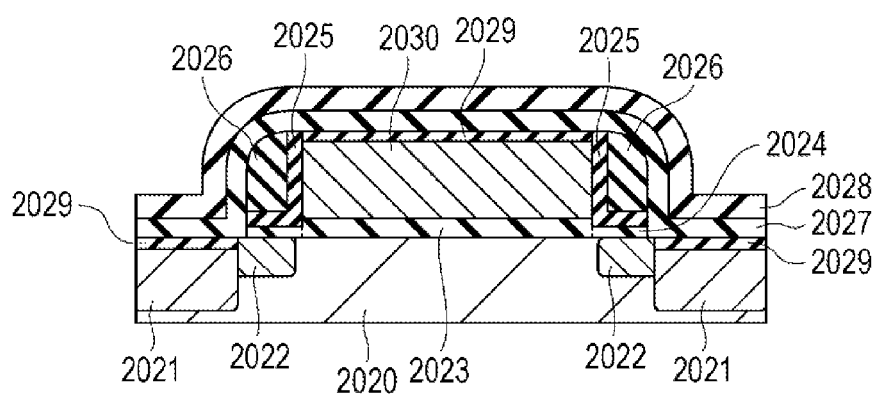

The structure of the transistors of a thus produced solid-state image pickup apparatus will be described with reference to FIGS. 20A and 20B. A transfer transistor will be described as a representative of the transistors in the pixel section, and a high-voltage N-type transistor will be described as a representative of the transistors in the peripheral circuit portion. FIG. 20A is a schematic enlarged view of the gate electrode of the transfer transistor and its vicinity, and FIG. 20B is a schematic enlarged view of the gate electrode of the high-voltage N-type transistor and its vicinity. FIGS. 20A and 20B show the states of the gate electrodes of the transfer transistor and the high-voltage N-type transistor shown in FIG. 19A, respectively.

The N-type semiconductor region 2000, the charge storage region 2001 and the FD region 2002 shown in FIG. 20A are contained in the semiconductor substrate 301 shown in FIG. 18A. A gate insulating film 2004 and a gate insulating film extension 2003 are provided so as to cover the semiconductor substrate.

The gate insulating film extension 2003 extends below the gate electrode 2005 over the charge storage region 2001 and the FD region 2002. The gate insulating film 2004 has a larger thickness than the gate insulating film extension 2003, but this may be altered if necessary. An insulating film 2006 made of silicon oxide covers the gate electrode 2005, the charge storage region 2001 and the FD region 2002. Both a first insulating member 2011 and the insulating film 2006 are made of silicon oxide. An insulating film 2007 made of silicon nitride is provided over the insulating film 2006, covering the gate electrode 2005, the charge storage region 2001 and the FD region 2002. By providing the insulating film 2006 between the charge storage region 2001, or PD, and the insulating film 2007, dark current can be reduced. In addition, an insulating film 2008 made of silicon oxide is provided over the insulating film 2007, covering the gate electrode 2005, the charge storage region 2001 and the FD region 2002. Furthermore, an insulating film 2009 made of silicon oxide and an insulating film 2010 made of silicon nitride are provided on the insulating film 2008 only in the region corresponding to the charge storage region 2001. Insulating film 2010 is disposed on insulating film 2009. The components or members in the structure shown in FIG. 20A correspond to those shown in FIGS. 16A to 19B as below. Insulating film 2006 corresponds to insulating film 1713; insulating films 2006 and 2007 correspond to insulating film 1713; first insulating member 2011 corresponds to first insulating member 1708; insulating film 2008 corresponds to insulating film 1806; and insulating films 2009 and 2010 correspond to insulating film 1901. Insulating film 2006 and insulating member 2011 are both made of silicon oxide and can be considered to be an integrated single film. More specifically, the silicon oxide film extending over the region from the PD to the gate electrode has a shape whose thickness is increased over the gate electrode.

FIG. 20B shows a P-type semiconductor region 2020, N-type semiconductor regions 2021 acting as source/drain regions, and N-type semiconductor regions 2022 acting as part of the source/drain regions, having a lower impurity concentration than the N-type semiconductor regions 2021. These are contained in the semiconductor substrate 301 shown in FIG. 19A. A gate insulating film 2023 and a gate insulating film extension 2024 are provided so as to cover the semiconductor substrate. The gate insulating film extension 2024 is the portion below the gate electrode 2030 extending so as to cover the N-type semiconductor regions 2022. The gate insulating film 2023 has a larger thickness than the gate insulating film extension 2024, but this may be altered if necessary. Silicide regions 2029 are provided on the gate electrode 2030 and the N-type semiconductor regions 2021. An insulating film 2025 made of silicon oxide and an insulating film 2026 made of silicon nitride form side spacers. The side spacers are disposed in contact with the side surface of the gate electrode 2030 over the N-type semiconductor regions 2022. Insulating film 2025 is disposed between insulating film 2026 and the gate electrode 2030. By providing the silicon oxide insulating film between the silicon nitride film and the gate electrode or the semiconductor regions, the reliability of the transistor can be maintained. An insulating film 2027 made of silicon oxide and an insulating film 2028 made of silicon nitride are provided so as to cover the N-type semiconductor regions 2021, the side spacers and the gate electrode 2030. Insulating film 2028 is disposed on insulating film 2027. By providing the silicon oxide film between the N-type semiconductor regions 2021 and the silicon nitride film, the silicon nitride film is separated from the main surface 302 of the semiconductor substrate. Consequently, the occurrence of dark current can be reduced. The components or members in the structure shown in FIG. 20B correspond to those shown in FIGS. 16A to 19B as below. Insulating films 2025 and 2026 correspond to the side spacer 1714; and insulating films 2027 and 2028 correspond to insulating film 1902.

As with the case described with reference to FIGS. 16A to 19B, insulating films 2006 and 2025 are made of the same film and insulating films 2007 and 2026 are made of the same film, in the embodiments shown in FIGS. 20A and 20B. Also, in the embodiment shown in FIGS. 20A and 20B, insulating films 2009 and 2027 are made of the same film and insulating films 2010 and 2028 are made of the same film. Thus, the number of the steps for forming films can be reduced, and the diffusion of impurities caused by heat during forming films can be suppressed.

The insulating films 2007 and 2028 can function as etching stop films when contact holes are formed. The insulating film 2007 is in contact with plugs 1903 and covers the pixel section except the plugs 1903, as shown in FIG. 19B. Also, the insulating film 2028 is in contact with plugs 1904 and covers the peripheral circuit section 1016 except the plugs 1904. The insulating film 2028 may extend to the pixel section 1011, but desirably except for the plugs 1908 in the pixel section. This is because the insulating film 2028 is made of silicon nitride, and the presence of a silicon nitride film makes complicated the etching for forming contact holes for the plugs 1903. In the multilayer structure of the insulating films of the present embodiment, a silicon oxide film, a silicon nitride film and a silicon oxide film are disposed on a semiconductor substrate, in that order from the semiconductor substrate side, in both the pixel section 1011 and the peripheral circuit section 1016. This structure allows simultaneous etching for forming contact holes in the pixel section 1011 and the peripheral circuit section 1016. It is however advantageous that the contact holes for plugs 1903 in the pixel section 1011 and the contact holes for plugs 1904 in the peripheral circuit section 1016 are formed in different steps. To be more precise, it is advantageous that when the contact holes for the plugs 1904 in the peripheral circuit section 1016 are formed, the contact holes for the plugs 1903 in the pixel section 1011 are still not formed or the contact holes are filled with plugs or a photoresist mask. In other words, it is desirable that non-silicide regions be not exposed when the contact holes for the plugs 1904 in the peripheral circuit section 1016 are formed. For example, contact holes for the plugs 1903 are formed, the plugs 1903 are formed in the contact holes, then contact holes for the plugs 1904 are formed, and the plugs 1904 are formed. If the contact holes are formed at one time, non-silicide regions of the main surface 302 of the semiconductor substrate are exposed by the operation for forming the contact holes in the peripheral circuit section 1016 that exposes the silicide region. In this instance, the metal in the silicide region is likely to be scattered by the etching for forming the contact holes, consequently contaminating non-silicide regions.

Although, in the present embodiment, the silicide regions are provided over the gate electrodes and source/drain regions of the transistors in the peripheral circuit section, the silicide region may be provided over any one of these portions in another embodiment. The silicide region may be provided over any one of the transistors in the pixel section.

Although the solid-state image pickup apparatus of the present embodiment has waveguides as in the first embodiment, the present invention may be applied to a structure having no waveguides or insulating film 1901, as shown in FIG. 21.

As described above, the structures of the embodiments of the invention allow waveguides to be formed without degrading the function of the antireflection film. In addition, since insulating films are provided according to the photoelectric conversion portions, the divergence of light from the bottom of the waveguide can be suppressed, and thus light collection efficiency can be increased. Furthermore, damage from the formation of contact holes in the peripheral circuit section can be reduced, and accordingly, a high-quality solid-state image pickup apparatus can be achieved. The disclosed embodiments may be modified as required. For example, the antireflection film may be provided one for each photoelectric conversion portion. Each embodiment may be combined with another embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026347 filed Feb. 9, 2011 and No. 2011-223291 filed Oct. 7, 2011, which are hereby incorporated by reference herein in their entirety.

What is claimed is:

1. A method for manufacturing a solid-state image pickup apparatus including (a) a first photoelectric conversion portion disposed in a semiconductor substrate, (b) a second photoelectric conversion portion disposed in the semiconductor substrate, (c) a first gate electrode disposed above the semiconductor substrate, (d) a second gate electrode disposed above the semiconductor substrate, (e) a first insulating film functioning as an antireflection film and extending over the first photoelectric conversion portion, the second photoelectric conversion portion, the first gate electrode, and the second gate electrode, (f) a second insulating film disposed on the first insulating film over the first photoelectric conversion portion and the first gate electrode, (g) an another second insulating film disposed on the first insulating film over the second photoelectric conversion portion and the second gate electrode, and separated from the second insulating film, (h) a first waveguide having a clad and a core, and (i) a second waveguide having a clad and a core, the method comprising:

forming openings by partially etching a member disposed over the first photoelectric conversion portion and the second photoelectric conversion portion under a condition that etching speed when the member is etched is faster than etching speed when the second insulating film and the another second insulating film are etched, the openings exposing the second insulating film and the another second insulating film, for forming the clad, and forming the cores in the openings, the cores disposed on the second insulating film and the another second insulating film, wherein the second insulating film has an edge arranged above the first gate electrode, and the another second insulating film has an edge arranged above the second gate electrode.

2. The method according to claim 1, wherein the first insulating film is a multilayer antireflection film.

3. The method according to claim 1, wherein the first insulating film includes an insulating layer made of silicon nitride and an insulating layer made of silicon oxide on the insulating layer made of silicon nitride.

4. The method according to claim 1, wherein the core, the second insulating film and the another second insulating film are made of the same material.

5. A solid-state image pickup apparatus comprising:

a first photoelectric conversion portion and a second photoelectric conversion each disposed in a semiconductor substrate;

a first gate electrode for transferring carriers from the first photoelectric conversion portion and a second gate electrode for transferring carriers from the second photoelectric conversion portion each disposed above athe semiconductor substrate;

a first insulating film disposed over the first photoelectric conversion portion, the second photoelectric conversion portion, the first gate electrode, and the second gate electrode, functioning as an antireflection film;

a second insulating film disposed on the first insulating film over the first photoelectric conversion portion and the first gate electrode, and having an edge arranged above the first gate electrode;

another second insulating film disposed on the first insulating film over the second photoelectric conversion portion and the second gate electrode, separated from the second insulating film, and having an edge arranged above the second gate electrode;

a first waveguide including a clad and a core, the core of the first wave guide being in contact with the second insulating film, the core of the first wave guide being made of the same material as the second insulating film, and a second wave guide including a clad and a core, the core of the second wave guide being in contact with the another second insulating film, the core of the second wave guide being made of the same material as the another second insulating film.

6. The solid-state image pickup apparatus according to claim 5, wherein the first insulating film includes an insulating layer made of silicon nitride and an insulating layer made of silicon oxide on the insulating layer made of silicon nitride, and the second insulating film is made of silicon nitride.

7. The solid-state image pickup apparatus according to claim 5, wherein an upper surface of the second insulating film lies closer to the semiconductor substrate than an upper surface of the first gate electrode.

8. An image pickup system comprising:

the solid-state image pickup apparatus as set forth in claim 5; and a signal processing device that processes electrical signals from the solid-state image pickup apparatus.

9. A method for manufacturing a solid-state image pickup apparatus, comprising:
preparing a member including a substrate on which a first photoelectric conversion portion, a second photoelectric conversion portion, a first gate electrode configured to transfer electrical charge of the first photoelectric conversion portion, and a second gate electrode configured to transfer electrical charge of the second photoelectric conversion portion are disposed, a first insulating film functioning as an antireflection film and extending over the first photoelectric conversion portion, the second photoelectric conversion portion, the first gate electrode and the second gate electrode, a second insulating film disposed on the first insulating film over the first photoelectric conversion portion, and another second insulating film being separated from the second insulating film and being disposed on the first insulating film over the second photoelectric conversion portion;
forming a first interlayer insulating film on the second insulating film and the another second insulating film;
forming a wiring layer on the first interlayer insulating film;
forming a second interlayer insulating film on the wiring layer;
forming an opening which passes through the first interlayer insulating film and the second interlayer insulating film by removing a part of the first interlayer insulating film and a part of the second interlayer insulating film; and
forming, at the opening, a member having a refractive index higher than those of the first interlayer insulating film and the second interlayer insulating film,
wherein the second insulating film is arranged so as to cover part of the first gate electrode and the another second insulating film is arranged so as to cover part of the second gate electrode,
wherein the second insulating film has an edge arranged above the first gate electrode and the another second insulating film has an edge arranged above the second gate electrode, and
wherein the forming of the opening is performed under a condition that etching speed when the second insulating film and the another second insulating film are etched is slower than etching speed when the first interlayer insulating film is etched.

10. The method according to claim 9, wherein the first insulating film is a multilayer film.

11. The method according to claim 9, wherein the first insulating film includes an insulating layer made of silicon nitride and an insulating layer made of silicon oxide on the insulating layer made of silicon nitride.

12. The method according to claim 9, wherein the member, the second insulating film and the another second insulating film are made of the same material.

13. The method according to claim 9, wherein the second insulating film and the another second insulating film are formed by low-pressure plasma CVD.

14. The method according to claim 9, wherein the member is formed by high-density plasma CVD.

15. The method according to claim 9, wherein the first insulating film is formed by plasma CVD.

16. A solid-state image pickup apparatus comprising:
a first photoelectric conversion portion and a second photoelectric conversion portion each disposed in a substrate;
a first gate electrode configured to transfer electric charges of the first photoelectric conversion portion and a second gate electrode configured to transfer electric charges of the second photoelectric conversion portion, the first gate electrode and the second gate electrode each being disposed above the substrate;
a first insulating film functioning as an antireflection film and extending over the first photoelectric conversion portion, the second photoelectric conversion portion, the first gate electrode and the second gate electrode;
a second insulating film functioning as an etching stop film and disposed on the first insulating film on the first photoelectric conversion portion;
another second insulating film functioning as an etching stop film and disposed on the first insulating film on the second photoelectric conversion portion, the another second insulating film being separated from the second insulating film;
a first interlayer insulating film disposed on the second insulating film and the another second insulating film;
a first wiring layer disposed on the first interlayer insulating film;
a second interlayer insulating film disposed on the first wiring layer; and
a waveguide having a core, the core being disposed on the second insulating film and having a refractive index higher than of those the first interlayer insulating film and the second interlayer insulating film,
wherein the second insulating film is arranged so as to cover part of the first gate electrode and the another second insulating film is arranged so as to cover part of the second gate electrode, and
wherein the second insulating film has an edge arranged above the first gate electrode and the another second insulating film has an edge arranged above the second gate electrode.

17. The solid-state image pickup apparatus according to claim 16, wherein an upper surface of the second insulating film is arranged closer to the substrate than an upper surface of the first gate electrode and an upper surface of the second gate electrode.

18. The solid-state image pickup apparatus according to claim 16,
wherein the first insulating film includes an insulating layer made of silicon nitride and an insulating layer made of silicon oxide on the insulating layer made of silicon nitride, and
wherein the second insulating film and the another second insulating film are made of silicon nitride.

19. An image pickup apparatus system comprising the solid-state image pickup apparatus according to claim 16 and a signal processing apparatus configured to process an electrical signal from the solid-state image pickup apparatus.

* * * * *